(12) United States Patent
Pacha et al.

(10) Patent No.: US 7,958,418 B2
(45) Date of Patent: Jun. 7, 2011

(54) CIRCUIT ARRANGEMENT, ELECTRONIC MECHANISM, ELECTRICAL TURN OUT AND PROCEDURES FOR THE OPERATION OF ONE CIRCUIT ARRANGEMENT

(75) Inventors: Christian Pacha, Munich (DE); Stephan Henzler, Taufkirchen (DE); Siegmar Koppe, Munich (DE); Joerg Berthold, Munich (DE)

(73) Assignee: Infineon Technologies AG, Neubiberg (DE)

( * ) Notice: Subject to any disclaimer, the term of this patent is extended or adjusted under 35 U.S.C. 154(b) by 460 days.

(21) Appl. No.: 12/028,657

(22) Filed: Feb. 8, 2008

(65) Prior Publication Data
US 2008/0250285 A1 Oct. 9, 2008

(51) Int. Cl.
*G01R 31/28* (2006.01)
(52) U.S. Cl. .................. 714/726; 714/727; 714/729
(58) Field of Classification Search .................. None
See application file for complete search history.

(56) References Cited

U.S. PATENT DOCUMENTS

| | | | | |
|---|---|---|---|---|
| 5,689,517 | A * | 11/1997 | Ruparel | 714/731 |
| 6,728,915 | B2 * | 4/2004 | Whetsel | 714/727 |
| 6,911,854 | B2 | 6/2005 | Klass | |
| 6,944,784 | B2 | 9/2005 | Clark et al. | |
| 6,972,598 | B2 * | 12/2005 | Yoo | 326/95 |
| 2002/0184584 | A1 * | 12/2002 | Taniguchi et al. | 714/726 |
| 2004/0196067 | A1 * | 10/2004 | Hossain et al. | 326/112 |
| 2005/0268191 | A1 * | 12/2005 | Shin | 714/726 |
| 2005/0289417 | A1 * | 12/2005 | Schuelein | 714/726 |
| 2006/0168489 | A1 * | 7/2006 | Mitra et al. | 714/724 |
| 2007/0300108 | A1 * | 12/2007 | Saint-Laurent et al. | 714/726 |

FOREIGN PATENT DOCUMENTS

| | | |
|---|---|---|
| EP | 0717287 | 6/1996 |
| EP | 1233277 | 8/2002 |

OTHER PUBLICATIONS

Ando, et al., "A 1.3-GHz-Generation SPARC64 Microprocessor", IEEE Journal of Solid-State Circuits, vol. 38, No. 11, Nov. 2003, pp. 1896-1905.
Clark, "An Embedded 32-b Microprocessor Core for Low-Power and High-Perfomance Applications", IEEE Journal of Solid-State Circuits, vol. 36, Nol 11, Nov. 2001, pp. 1599-1608.
Garg, et al., "High Performance Pipelining Method for Static Circuits using Heterogeneous Pipelining Elements", ESSCIRC 2003.
Naffziger, et al., "The Implementation of the Itanium 2 Microprocessor", IEEE Journal of Solid-State Circuits, vol. 37, No. 11, Nov. 2002, pp. 1448-1460.
Tschanz, et al., "Comparative Delay and Energy of Single Edge-Triggered & Dual Edge-Triggered Pulsed Flip-Flops for High-Performance Microprocessors", IEEE Int. Sysmposium on Low Power Electronics and Design, Aug. 2001.

* cited by examiner

*Primary Examiner* — Jeffrey A Gaffin
*Assistant Examiner* — Guerrier Merant
(74) *Attorney, Agent, or Firm* — Lee & Hayes, PLLC

(57) ABSTRACT

A circuit arrangement may include a scan test input stage having a test input for receiving a test signal, wherein the scan test input stage can be switched in high-impedance state; a data input stage having a data input for receiving a data signal, wherein the data input stage can be switched in high-impedance state. The circuit arrangement may further include a latch coupled to at least one output of the scan test input stage and to at least one output of the data input stage; and a drive circuit, which is configured to generate a pulsed clock signal for the data input stage and a signal for driving the scan test input stage.

21 Claims, 13 Drawing Sheets

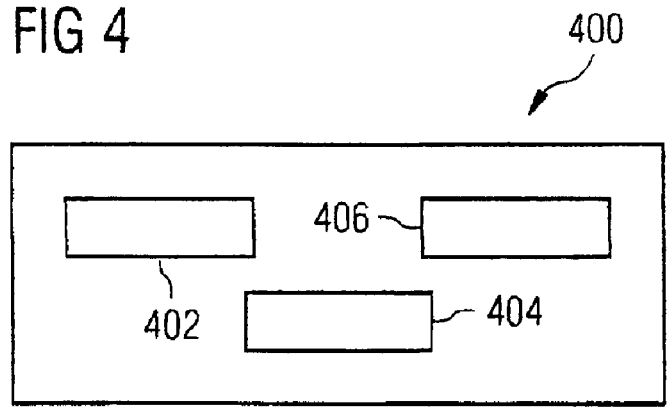
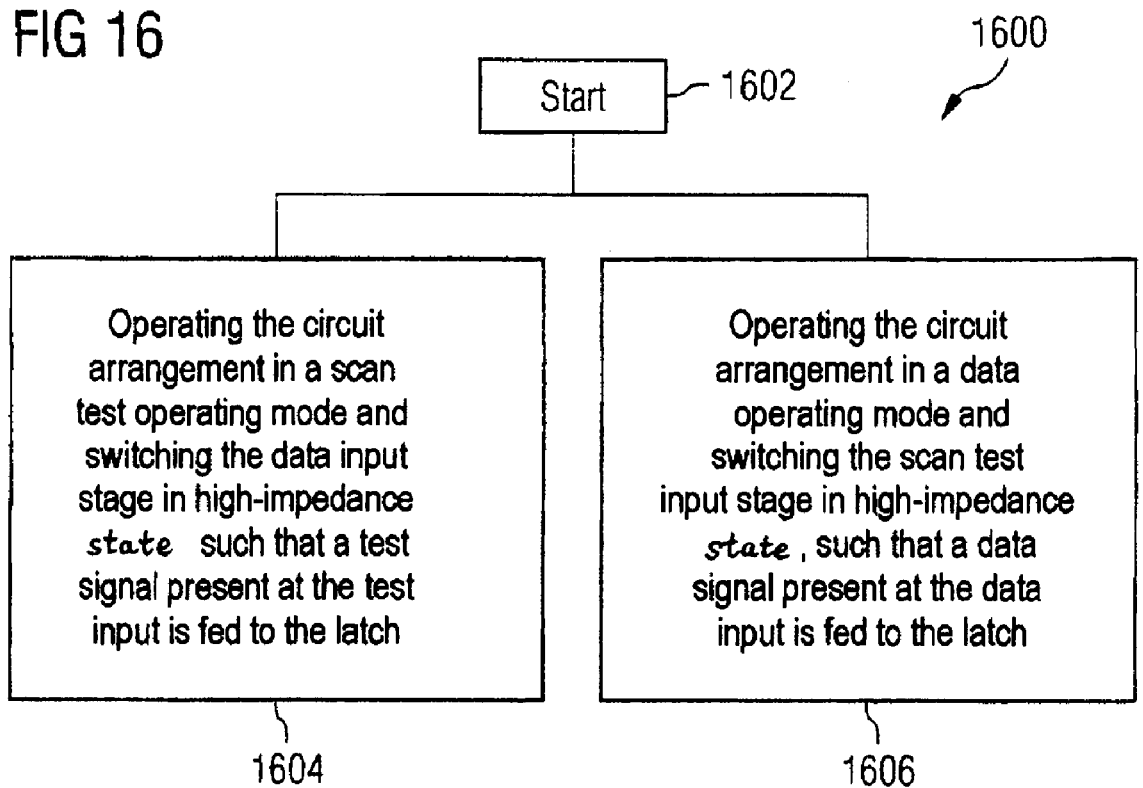

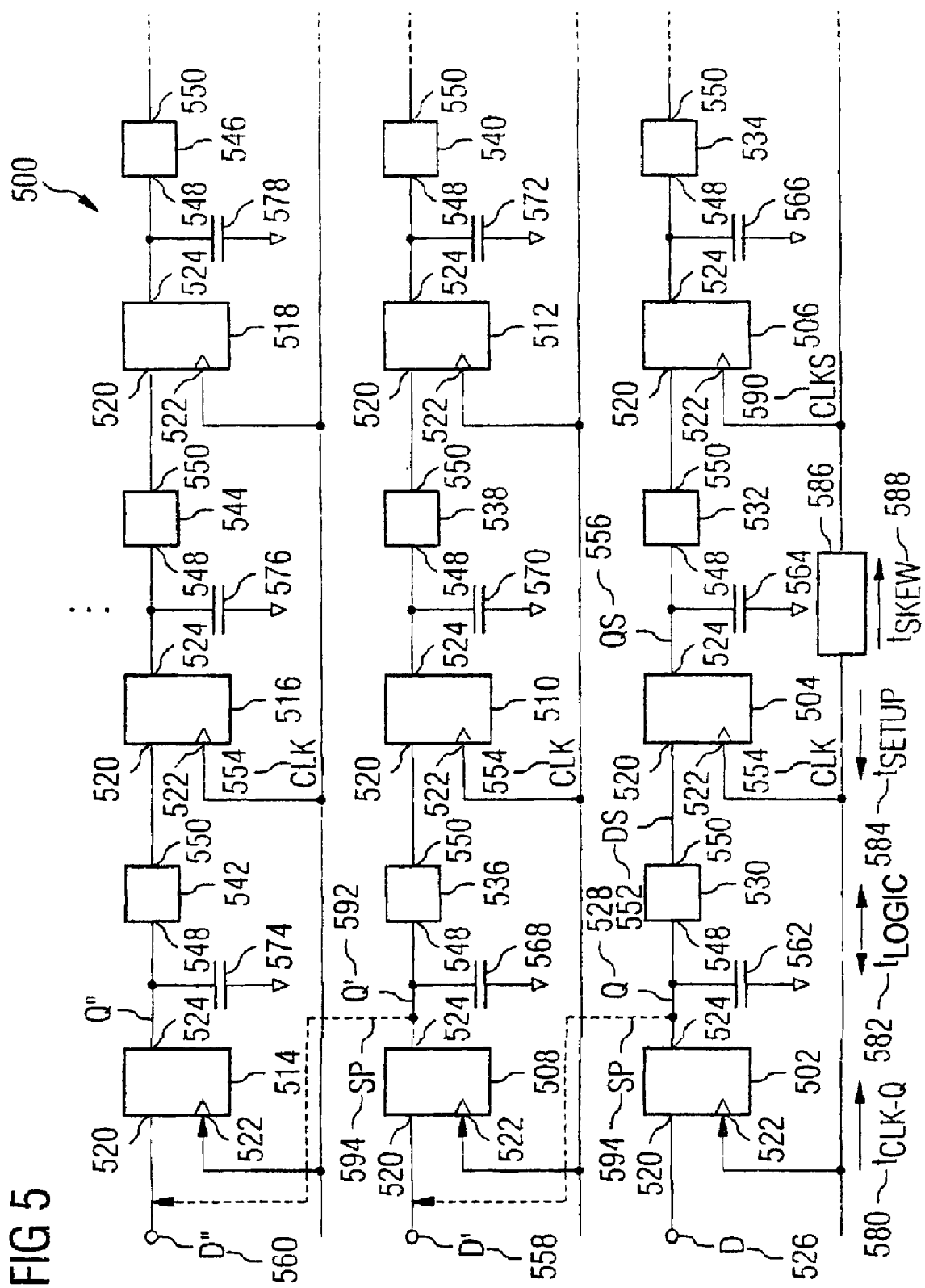

US 7,958,418 B2

CIRCUIT ARRANGEMENT, ELECTRONIC MECHANISM, ELECTRICAL TURN OUT AND PROCEDURES FOR THE OPERATION OF ONE CIRCUIT ARRANGEMENT

TECHNICAL FIELD

Embodiments relate to a circuit arrangement, an electronic device, an electrical apparatus and a method for operating a circuit arrangement.

BACKGROUND

Flip-flops usually serve for storing logic states in digital circuits, for example microprocessors or DSPs.

For a circuit arrangement having a multiplicity of flip-flops, for example for a microprocessor, it is desirable, in addition to the conventional operating mode for processing data signals, to be able to test the flip-flops and logic, for example by means of a so-called scan test method, in a simple and reliable manner.

BRIEF DESCRIPTION OF THE DRAWINGS

In the drawings, like reference characters generally refer to the same parts throughout the different views. The drawings are not necessarily to scale, emphasis instead generally being placed upon illustrating the principles of embodiments of the invention. In the following description, various embodiments of the invention are described with reference to the following drawings, in which:

FIG. 4 shows an electrical apparatus in accordance with an embodiment;

FIG. 5 shows a plurality of pipeline stages with a multiplicity of flip-flops in accordance with an embodiment;

FIG. 16 shows a method for operating a circuit arrangement in accordance with an embodiment.

DESCRIPTION

In the context of this description, the terms "connected", and "coupled" are used to describe both a direct and an indirect connection and also a direct or indirect coupling.

Figure 1:
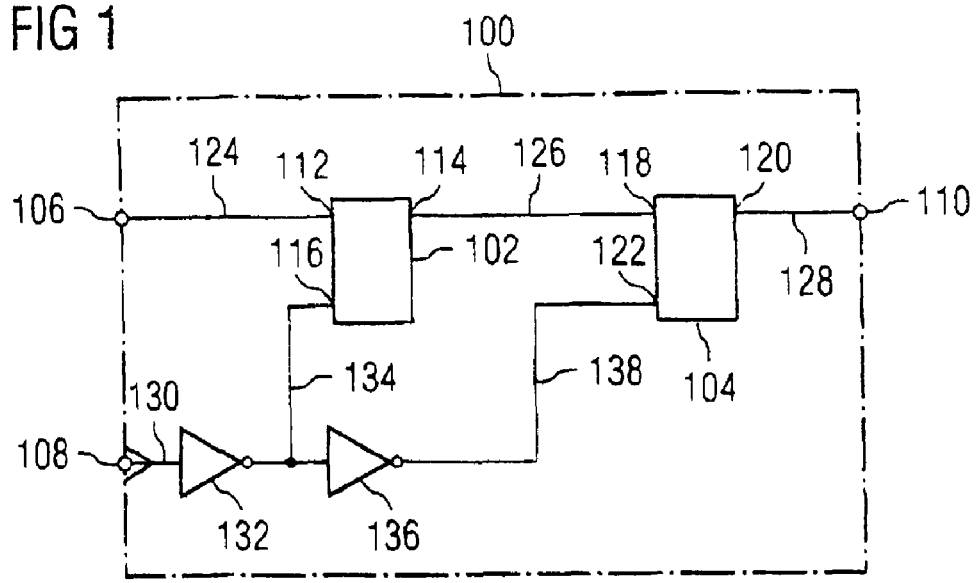
FIG. 1 shows a conventional master-slave flip-flop.

FIG. 1 shows a conventional clock-signal-edge-triggered flip-flop 100 including a master latch 102 and a slave latch 104. The flip-flop 100 has a data input 106, a clock signal input 108 and a data output 110. The master latch 102 has a data input 112, a data output 114 and also a clock signal input 116. The slave latch 104 likewise has a data input 118, a data output 120 and also a clock signal input 122. An input datum 124 (D), also referred to as input data signal 124, is fed to the data input 112 of the master latch 102, and the output datum 126 (QI) of the master latch 102 is fed to the data input 118 of the slave latch 104. The output datum 128 (Q) of the flip-flop 100 can be tapped off at the data output 120 of the slave latch 104.

A clock signal 130 (CLK), which is inverted and delayed by means of a first inverter 132 to form a first delayed and inverted clock signal 134 (CLK'), is fed to the clock signal input 116. The first delayed and inverted clock signal 134 is fed to the clock signal input 116 of the master latch 102. Furthermore, the first delayed and inverted clock signal 134 is inverted and additionally delayed by means of a second inverter 136 to form a second delayed and inverted clock signal 138 (CLK"). The second delayed and inverted clock signal 138 is fed to the clock signal input 122 of the slave latch 104.

Upon a rising clock signal edge of the clock signal 130, the slave latch 104 is switched in transparent state and the master latch 102 is latched. Upon a falling clock signal edge of the clock signal 130, the master latch 102 is switched in transparent state and the slave latch 104 is latched. In this way, an input datum 124 present at the data input 106 of the flip-flop 100 is firstly read into the master latch 102 (if the master latch 102 is switched in transparent state and the slave latch 104 is latched) and is then transferred from the master latch 102 into the slave latch 104 upon the next edge change, from which slave latch the input datum 124 is then provided at the data output 110 of the flip-flop 100.

Figure 2:
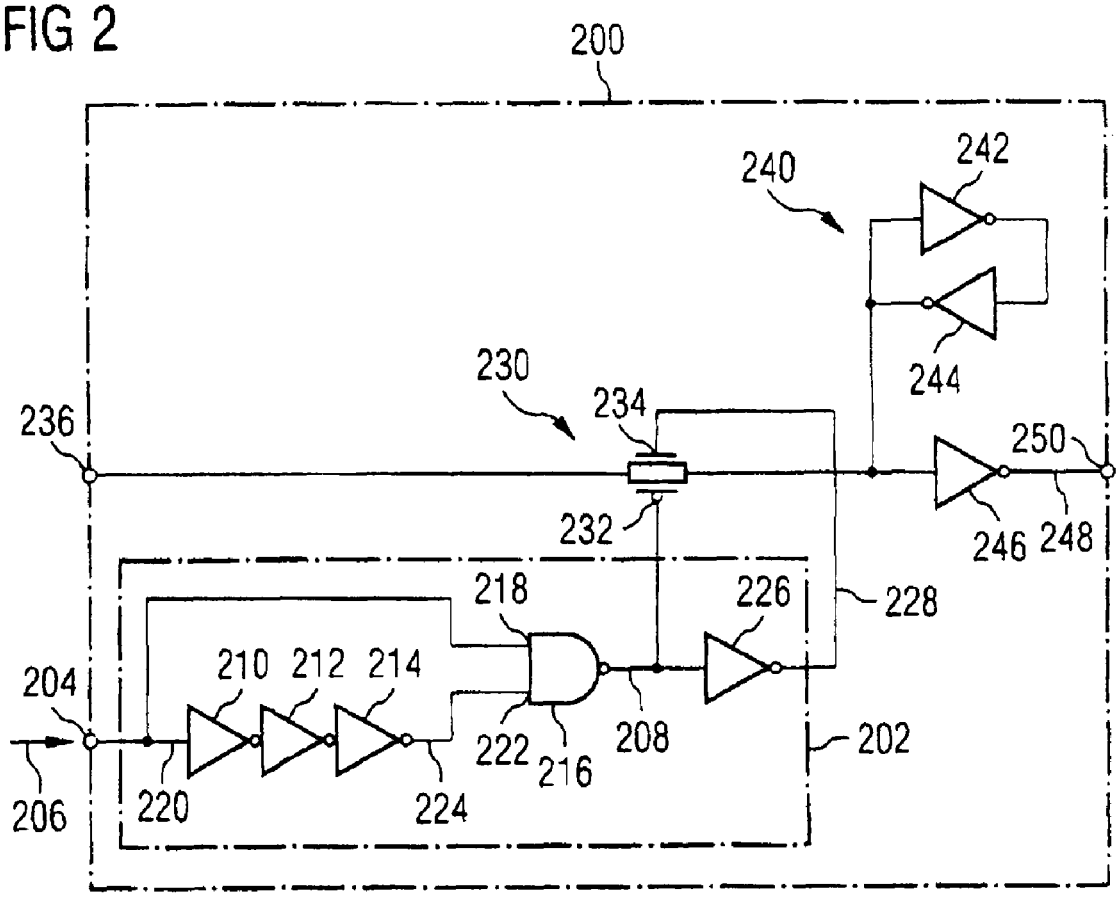
FIG. 2 shows a conventional pulsed flip-flop.

FIG. 2 shows a conventional pulsed flip-flop (also referred to as pulse-triggered flip-flop) 200, which has a higher speed compared with the master-slave flip-flop 100 from FIG. 1. The pulsed flip-flop 200 has a pulse generator 202, which generates a flip-flop-internal pulse signal 208 (/PULSE) from a flip-flop-external clock signal 206 (CLK) present at the clock signal input 204.

In this case, the pulse generator 202 has three inverters coupled to one another in series (a first inverter 210, a second inverter 212, a third inverter 214), and also a NAND gate 216. The flip-flop-external clock signal 206 is fed to a first input 218 of the NOR gate 216. Furthermore, the flip-flop-external clock signal 206 is fed to an input 220 of the first inverter 210 and respectively inverted and delayed by means of the three inverters 210, 212, 214, such that an inverted and delayed clock signal 224 (CLK') is generated, which is fed to a second input 222 of the NOR gate 216. Furthermore, the pulse generator 202 has a fourth inverter 226, the input of which receives the flip-flop-internal pulse signal 208, inverts and delays it and provides it as inverted flip-flop-internal pulse signal 228 (PULSE).

Furthermore, a transmission gate 230 is provided in the pulsed flip-flop 200. The flip-flop-internal pulse signal 208 is fed to a first control input 232 of the transmission gate 230, and the inverted flip-flop-internal pulse signal 228 is fed to a second control input 234 of the transmission gate 230.

Furthermore, the pulsed flip-flop 200 has a data input 236, to which an input datum 238 (D) (also referred to as data signal) is applied. The input datum 238 is passed to a latch 240 by means of the transmission gate 230 (if the latter is driven correspondingly), said latch being realized as two feedback inverters 242, 244 in one embodiment. The input datum 238 that is buffer-stored in this way is provided as an inverse output datum 248 (/Q) at a data output 250 by means of a fifth inverter 246 likewise provided in the pulsed flip-flop 200.

The transmission gate 230 is driven by means of the mutually complementary control signals (the flip-flop-internal pulse signal 208 and the inverted flip-flop-internal pulse signal 228) which each have a pulsed form, for example a pulse duration within a range of approximately 50 ps to approximately 200 ps, for example within a range of approximately 100 ps to approximately 150 ps, for example approximately 125 ps (for example in the case of a 180 nm CMOS technology). Consequently, the transparency phase between the data input 236 of the pulsed flip-flop 200 and the data output 250 of the pulsed flip-flop 200 is controlled by means of the flip-flop-internal pulse signal 208 and the inverted flip-flop-internal pulse signal 228.

In the case of a pulsed flip-flop, the hold time ($t_{HOLD}$) is usually relatively long (for example within a range of approximately 80 ps to approximately 130 ps for CMOS RVT (regular voltage threshold) devices having a supply voltage of approximately 1.32 V in a 65 nm technology), given by the temporal duration of the pulse and thus reduces the so-called race immunity, which, in the case of a robust design, should be greater than the expected clock jitter.

Figure 3:
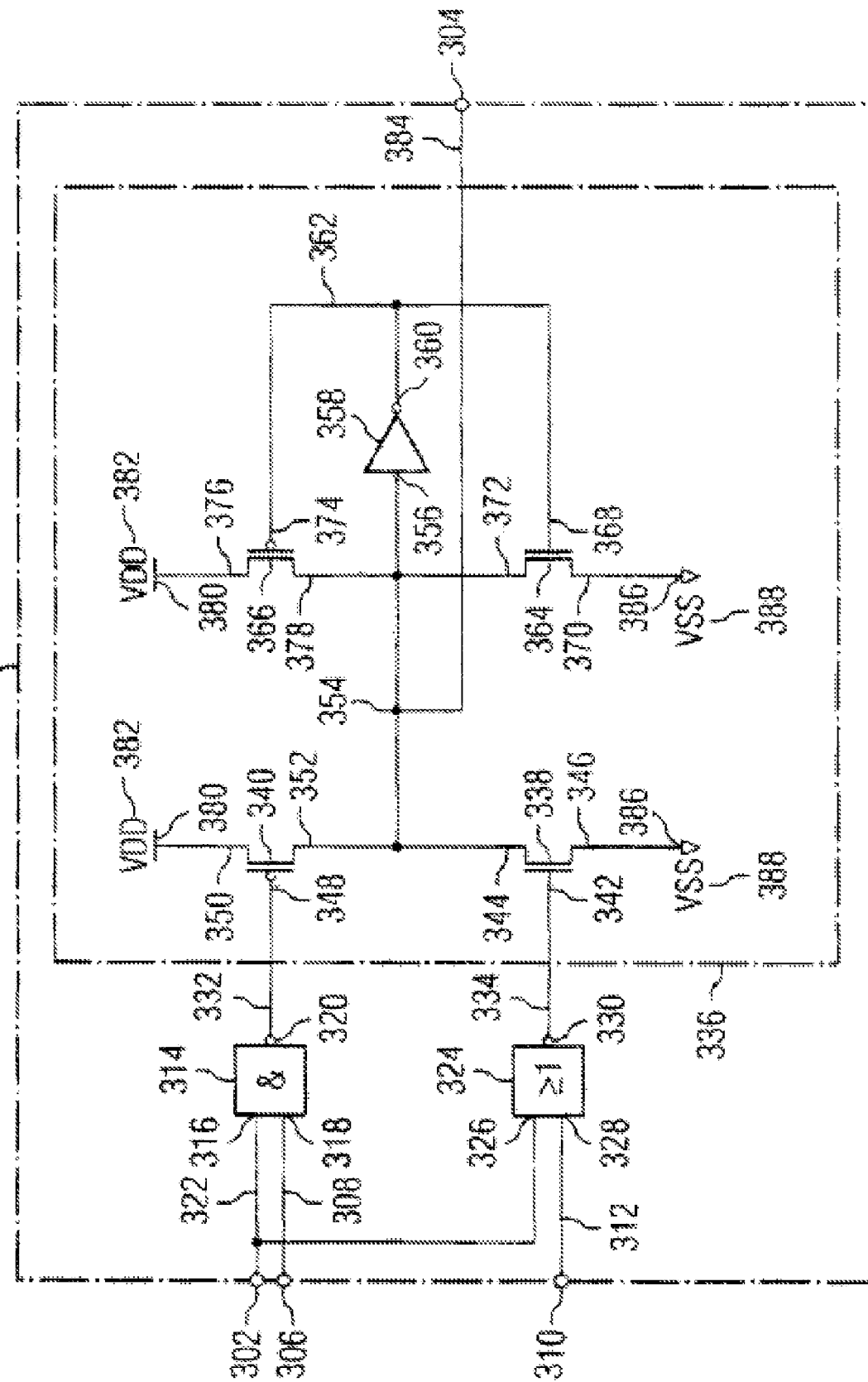
FIG. 3 shows another pulsed flip-flop.

FIG. 3 shows another pulsed flip-flop 300.

The pulsed flip-flop 300 has a data input 302, a data output 304 (at which an output signal 384 (/QT) is provided), a first pulse clock signal input 306 for coupling in (to put it another way receiving) a first pulse clock signal 308 (PULSE), and also a second pulse clock signal input 310 for coupling in a second pulse clock signal 312 (/PULSE), which is complementary to the first pulse clock signal 308.

Furthermore, the pulsed flip-flop 300 has a NAND gate 314 having a first input 316, a second input 318 and an output 320. The first input 316 is coupled to the data input 302 of the pulsed flip-flop 300, such that an input datum 322 (for example a logic signal) present at the data input 302 is fed to the first input 316 of the NAND gate 314. The second input 318 is coupled to the first pulse clock signal input 306 of the pulsed flip-flop 300, such that the first pulse clock signal 308 is fed to the second input 318 of the NAND gate 314. The NAND gate 314 provides a set signal 332 (/SET) at the output 320.

Furthermore, a NOR gate 324 having a first input 326, a second input 328 and an output 330 is provided in the pulsed flip-flop 300. The first input 326 is likewise coupled to the data input 302 of the pulsed flip-flop 300, such that the input datum 322 present at the data input 302 is fed to the first input 326 of the NOR gate 324. The second input 328 of the NOR gate 324 is coupled to the second pulse clock signal input 310 of the pulsed flip-flop 300, such that the second pulse clock signal 312 is fed to the second input 328 of the NOR gate 324. The NOR gate 324 provides a reset signal 334 (/RES) at its output 330.

The set signal 332 and the reset signal 334 serve for driving a latch arrangement 336.

The latch arrangement 336 has an NMOS push-pull transistor 338 and a PMOS push-pull transistor 340. The NMOS push-pull transistor 338 has a control terminal (for example a gate terminal) 342 and also a controllable path between a first source-drain terminal 344 and a second source-drain terminal 346. The PMOS push-pull transistor 340 has a control terminal (for example a gate terminal) 348 and also a controllable path between a first source-drain terminal 350 and a second source-drain terminal 352.

A potential node 354 is provided between the second source-drain terminal 352 of the PMOS push-pull transistor 340 and the first source-drain terminal 344 of the NMOS push-pull transistor 338, an input 356 of an inverter 358 being connected to said potential node. An internal data signal 362 (QI) (to put it another way an internal logic state) can be tapped off at an output 360 of the inverter 358.

Furthermore, the latch arrangement 336 has an NMOS hold transistor 364 and a PMOS hold transistor 366. The NMOS hold transistor 364 has a control terminal (for example a gate terminal) 368 and also a controllable path between a first source-drain terminal 370 and a second source-drain terminal 372. The PMOS hold transistor 366 has a control terminal (for example a gate terminal) 374 and also a controllable path between a first source-drain terminal 376 and a second source-drain terminal 378.

The first source-drain terminal 350 of the PMOS push-pull transistor 340 and the first source-drain terminal 376 of the PMOS hold transistor 366 are coupled to a first supply potential terminal 380, to which a first supply potential (for example $V_{DD}$) 382 is applied.

The second source-drain terminal 346 of the NMOS push-pull transistor 338 and the first source-drain terminal 370 of the NMOS hold transistor 364 are coupled to a second supply potential terminal 386, to which a second supply potential (for example $V_{SS}$) 388 is applied.

Furthermore, the following terminals are coupled to the potential node 354:
  the second source-drain terminal 352 of the PMOS push-pull transistor 340,
  the first source-drain terminal 344 of the NMOS push-pull transistor 338,
  the second source-drain terminal 372 of the NMOS hold transistor 364, and the second source-drain terminal 378 of the PMOS hold transistor 366.

The internal data signal 362 (QI) is passed to the control terminal 368 of the NMOS hold transistor 364 and also to the control terminal 374 of the PMOS hold transistor 366.

Upon a rising clock signal edge, for example, the first pulse clock signal 308 (PULSE) has a signal pulse having a predetermined pulse length. The second pulse clock signal 312 (/PULSE) is complementary to the first pulse clock signal 308 (PULSE). If the input datum 322 is for example at logic L level (low level) during the signal pulse of the first pulse clock signal 308 (PULSE), then the set signal 332 (/SET) supplies a logic H level (high level). The PMOS push-pull transistor 340 is thus turned off. At the same time, for the duration of the signal pulse width of the second pulse clock signal 312 (/PULSE), the reset signal 334 is at logic H level and therefore turns on the controllable path of the NMOS push-pull transistor 338. The potential node 354 is therefore pulled to the level of the second supply potential (for example $V_{SS}$) 388. This corresponds for example to a logic L level (for example 0 V). Consequently, a logic H level is present as logic level of the internal data signal 362 (QI) at the output 360 of the inverter 358.

By means of the loop between the output 360 of the inverter 358 and gate terminal 368 of the NMOS hold transistor 364 via the potential node 354 to the input 356 of the inverter 358, the latch arrangement 336 stores the level of the input datum 322, which can be tapped off as hold level at the potential node 354 and therefore as output signal 384 (/QI).

FIG. 4 shows an electrical apparatus 400 in accordance with an embodiment.

The electrical apparatus 400 can be any electrical apparatus having a circuit arrangement such as will be explained in more detail below. In an embodiment, the electrical apparatus 400 is a computer, for example a personal computer or a workstation or a portable computer such as, for example, a notebook, a laptop, a personal digital assistant (PDA) etc. In another embodiment, the electrical apparatus 400 is a communication device, for example a telecommunication device such as a telephone, for example. The communication device can be a mobile communication device, for example a cordless telephone or a mobile radio communication device or a WLAN communication device or a short-range radio communication device (for example a Bluetooth communication device).

In an embodiment, the electrical apparatus 400 has an integrated circuit 402 (as an example of an electronic device), for example a processor, for example a programmable processor, for example a microprocessor, a digital signal processor, a microcontroller, etc., wherein the integrated circuit 402 has a circuit arrangement which will be explained in more detail below.

The electrical apparatus 400 has, in addition to further optional components that are not explained in more detail here for reasons of simpler illustration, by way of example a display unit (for example a display) 404 and one or more memories 406 (for example a volatile memory (e.g. a dynamic random access memory (DRAM)) and/or a nonvolatile memory (e.g. a nonvolatile random access memory (NV-RAM), e.g. a flash memory (for example a floating gate memory or a charge trapping memory)). Instructions which are executed by the integrated circuit 402 can be stored in the memory 406. Furthermore, data which are processed by the integrated circuit 402 can be stored in the memory 406. Furthermore, the display unit 404 can display the results determined by the integrated circuit 402 to a user of the electrical apparatus 400.

FIG. 5 shows a plurality 500 of pipeline stages with a multiplicity of flip-flops in accordance with an embodiment. In an embodiment, the pipeline stage 500 is contained in a processor (for example in a microprocessor) integrated in the integrated circuit 402.

The pipeline stage 500 has flip-flops 502, 504, 506, 508, 510, 512, 514, 516, 518 (as an embodiment of a circuit arrangement). Each of the flip-flops 502, 504, 506, 508, 510, 512, 514, 516, 518 has a data input 520, a clock signal input 522 and a data output 524. The flip-flops 502, 504, 506, 508, 510, 512, 514, 516, 518 are clocked with a clock signal 554 (CLK) by means of their respective clock signal input 522.

By way of example, a data signal 526 (D) having a logic level high (high, for example within a range of approximately 1 V to approximately 3 V, for example within a range of approximately 1.3 V to approximately 2 V, for example within a range of approximately 1.5 V to approximately 2 V, or low, for example 0 V), is fed to the data input 520 of the first flip-flop 502. The corresponding output signal 528 (Q) is available at the data output 524 of the first flip-flop 502 and is fed to a first logic circuit 530 of a multiplicity of logic circuits 530, 532, 534, 536, 538, 540, 542, 544, 546. Each of the logic circuits 530, 532, 534, 536, 538, 540, 542, 544, 546 has an input 548 and an output 550. The output signal 528 (Q), also referred to as data signal 552 (DS), processed in accordance with the first logic circuit 530 is fed to the data input 520 of the second flip-flop 504, which is likewise clocked with the clock signal 554 (CLK), and a corresponding output signal 556 (QS) is provided at the data output 524 of the second flip-flop 504.

FIG. 5 illustrates by way of example three branches having serially interconnected flip-flops 502, 504, 506, 508, 510, 512, 514, 516, 518 and logic circuits 530, 532, 534, 536, 538, 540, 542, 544, 546.

In an embodiment, another data signal 558 (D') is fed to the second branch and yet another data signal 560 (D") is fed to the third branch. The logic circuits 530, 532, 534, 536, 538, 540, 542, 544, 546 represent loads to be driven for the data outputs 524 of the flip-flops 502, 504, 506, 508, 510, 512, 514, 516, 518. By way of example, the logic circuits 530, 532, 534, 536, 538, 540, 542, 544, 546 have capacitances, which are illustrated by way of example as capacitors 562, 564, 566, 568, 570, 572, 574, 576, 578 in FIG. 5.

In the context of a signal processing, signal delays occur on account of the properties of the flip-flops 502, 504, 506, 508, 510, 512, 514, 516, 518, on account of the duration of the signal processing in the logic circuits 530, 532, 534, 536, 538, 540, 542, 544, 546 and also in the branching trees for the clock signal 554.

In an embodiment, a flip-flop delay time $t_{CLK-Q}$ 580 could be understood to mean a signal delay time or delay between a clock signal edge that initiates the transparency phase of the respective flip-flop until the presence of the level corresponding to the respective data input signal (that is to say signal present at the data input 520 of the flip-flop) at the data output 522 of the flip-flop. Without restricting general validity, it is assumed in the following embodiments that a rising clock signal edge in each case marks the start point of a respective transparency phase of the respective flip-flop.

In an embodiment, a processing time $t_{logic}$ 582 of a respective logic circuit is of influence on the signal delay times.

In an embodiment, the so-called setup time $t_{SETUP}$ 584 of the respective flip-flops is furthermore of importance. In an embodiment, a setup time $t_{SETUP}$ could be understood to mean a time for which a data input signal (that is to say signal present at the data input 520 of the flip-flop) is present with respect to the rising clock signal edge of the clock signal in order that the flip-flop can detect the input signal level and reliably provides it at the data output (e.g. 524).

In an embodiment, the so-called hold time $t_{HOLD}$ of the respective flip-flops is furthermore of importance. In an embodiment, a hold time $t_{HOLD}$ could be understood to mean a time that specifies how long a data input signal (that is to say signal present at the data input 520 of the flip-flop) should remain at the logic level present upon a rising clock signal edge of the clock signal in order that said level is correctly detected and stored in the flip-flop.

The flip-flop delay time $t_{CLK-Q}$ 580; the setup time $t_{SETUP}$ 584 and the hold time $t_{HOLD}$ can have different values upon input signal level changes from logic "0" to logic "1" (to put it another way from logic "low" to logic "high") and from logic "1" to logic "0" (to put it another way from logic "high" to logic "low").

Furthermore, delays in the clock signal paths can result in skews between the rising clock signal edges at different flip-flops. This is illustrated in FIG. 5 by the block 586, which symbolizes a time skew $t_{SKEW}$ 588. The resulting skewed clock signal 590 (CLKS) is delayed by the delay time $t_{SKEW}$ 588 relative to the clock signal 554 (CLK).

The largest signal delay is usually caused by the respective logic circuit 530, 532, 534, 536, 538, 540, 542, 544, 546 having logic depths of 20 to 25. Typical values for the capacitances 562, 564, 566, 568, 570, 572, 574, 576, 578 lie within a range of approximately 40 fF and 80 fF.

If individual logic circuits 530, 532, 534, 536, 538, 540, 542, 544, 546 have particularly short signal delay times, hold time violations can occur since the data signal 552 (DS) fed to a flip-flop connected downstream performs a level change too early with respect to the required setup time $t_{SETUP}$ 584 or hold time $t_{HOLD}$. In order to treat different delays as a result of the logic circuits 530, 532, 534 in a signal branch, it is advantageous to make the transparency phase of the flip-flops changeable. In accordance with an embodiment, this can be done by a change in the signal pulses derived from the clock signal edge.

If the pipeline stage 500 is operated in a scan test operating mode, then for example the output signals 528 (Q) of the first flip-flop 502 in the first branch are fed as input signal 558 (D') to the fourth flip-flop 508 of the second branch and the corresponding output signal 592 (Q') of the fourth flip-flop 508 of the second branch is used as the input signal 560 (D") of the seventh flip-flop 514 of the third branch, etc.

Consequently, a shift register is clearly formed from the flip-flops 502, 508, 514 in the scan test operating mode. A test signal sequence is then coupled in at the data input 520 of the first flip-flop 502, which test signal sequence can be read out at the data output 524 of the last flip-flop of the shift register chain. The corresponding signal path is illustrated as a dash-dotted line 594 (SP) in FIG. 5. By means of the scan test operating mode it is possible to identify errors in the flip-flops of the shift register chain.

A description is given below of circuit arrangements for implementing a scan test function in flip-flops, for example in high-performance flip-flops. Hold time violations in the scan test operating mode are avoided in various embodiments.

This acquires particular importance for example for pulsed flip-flops, for example pulsed high-performance flip-flops, since with such flip-flops a compromise is made between short, in some instances even negative, setup times $t_{SETUP}$ and short flip-flop delay times $t_{CLK-Q}$ on the one hand, and (in comparison with conventional master-slave latch pairs) long hold times $t_{HOLD}$, on the other hand.

Pulsed flip-flops are usually used for accelerating time-critical paths. However, owing to the long hold times $t_{HOLD}$, an additional design outlay is conventionally required for so-called hold time fixing, for example by inserting additional buffers for hold time delay.

In an embodiment in which the high-performance flip-flops are used in the critical paths of embedded microprocessors such as, for example, ARM microprocessors or MIPS microprocessors, hold time violations could occur for example relatively frequently in the scan test signal path.

In accordance with an embodiment, this scenario is addressed by a circuitry solution.

In accordance with an embodiment, a flip-flop is provided which is operated as a pulsed flip-flop in a high-performance mode and as a conventional master-slave latch pair in a low-power mode.

The embodiments described below are particularly suitable for use in semicustom design flow.

Furthermore, the embodiments described below are very well suited to cost-sensitive low-power circuit arrangements and corresponding electrical apparatuses (such as, for example, for a baseband radio IC (integrated circuit) for example of a mobile radio communication terminal), since an inherently possible routing of a separate scan clock tree is not necessary in accordance with various embodiments.

Figure 6:
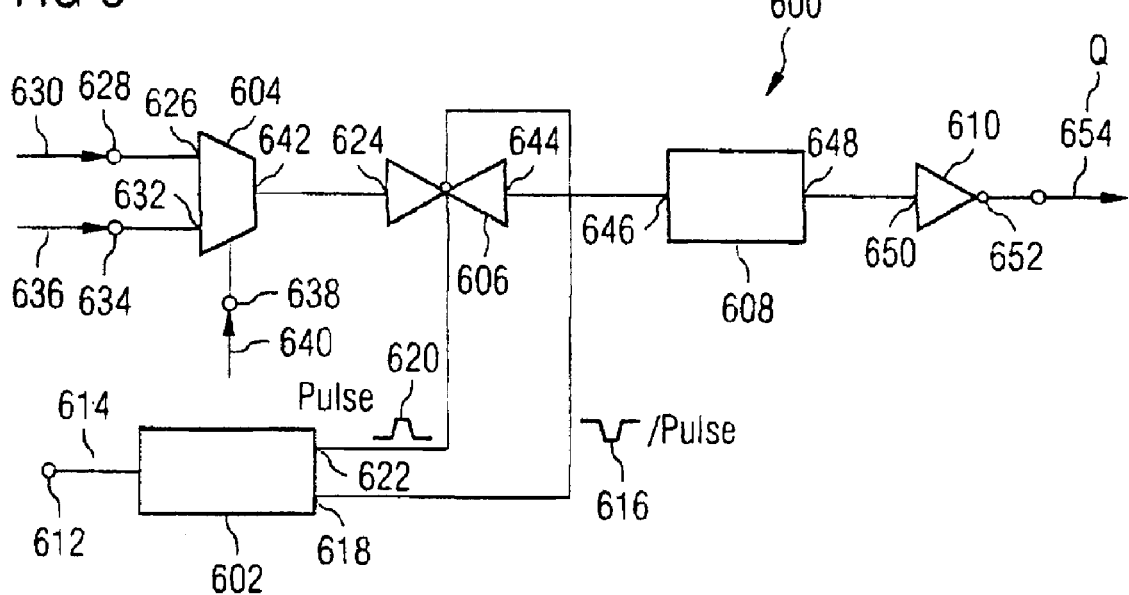
FIG. 6 shows a pulsed flip-flop with scan test extension.

FIG. 6 shows a pulsed flip-flop 600 with scan test extension.

The pulsed flip-flop 600 has a pulse clock signal generator 602, a multiplexer 604, a transmission gate 606, a latch 608 and also an output buffer 610 (for example realized as an inverter).

In accordance with an embodiment, the pulse clock signal generator 602 has the same structure as the pulse generator 202 of the flip-flop 200 in accordance with FIG. 2, for which reason a detailed description again is dispensed with at this juncture. The pulse clock signal generator 602 has a clock signal input 612, to which a flip-flop-external clock signal 614 (CLK) is applied. When the flip-flop-external clock signal 614 is present, the pulse clock signal generator 602 generates a flip-flop-internal pulse signal 616 (/PULSE) at a first pulse output 618. Furthermore, in this case the pulse clock signal generator 602 generates a complementary pulse signal 620 (PULSE), which is complementary to the flip-flop-internal pulse signal 616 (/PULSE), and provides it at a second pulse output 622.

The flip-flop-internal pulse signal 616 and the complementary pulse signal 620 are passed as control signals to the transmission gate 606 and control the blocking or transmission of a signal present at an input 624 of the transmission gate 606, as was described in connection with FIG. 2.

The multiplexer 604 has a first input 626 (which is coupled to a data input 628, at which a data signal 630 is present), a second input 632 (which is coupled to a test input 634, at which a test signal 636 is present), a control input 638 (at which a test activation signal 640 (TE) is present), and also an output 642. The output 642 of the multiplexer 604 is coupled to the input 624 of the transmission gate 606.

The data signal 630 or the test signal 636 (clearly the data input 628 or the test input 634) are switched to the transmission gate 606 depending on the signal state of the test activation signal 640 and thus depending on the state of the multiplexer 604 (for example for TE=1: scan test operating mode, that is to say that the test signal 636 is passed to the output 642 of the multiplexer 604; for TE=0: data operating mode (normal operating mode), that is to say that the data signal 630 is passed to the output 642 of the multiplexer 604).

An output 644 of the transmission gate 606 is coupled to an input 646 of the latch 608. This means that the signal provided at the output 642 of the multiplexer 604, given corresponding driving by the pulse clock signal generator 602, is passed to the input 646 of the latch 608 (for example during the transparency phase of the transmission gate 606 for a short region of the clock period after the rising clock signal edge). The signal provided at an output 648 of the latch 608 is passed to an input 650—which is coupled to the output 648 of the latch 608—of an output buffer 610, at the output 652 of which an output signal 654 (Q) is provided.

A typical embodiment for a standard cell library usually has for realization at least four stages that determine the flip-flop delay time $t_{CLK-Q}$ and also the data delay time $t_{data-Q}$.

Figure 7:
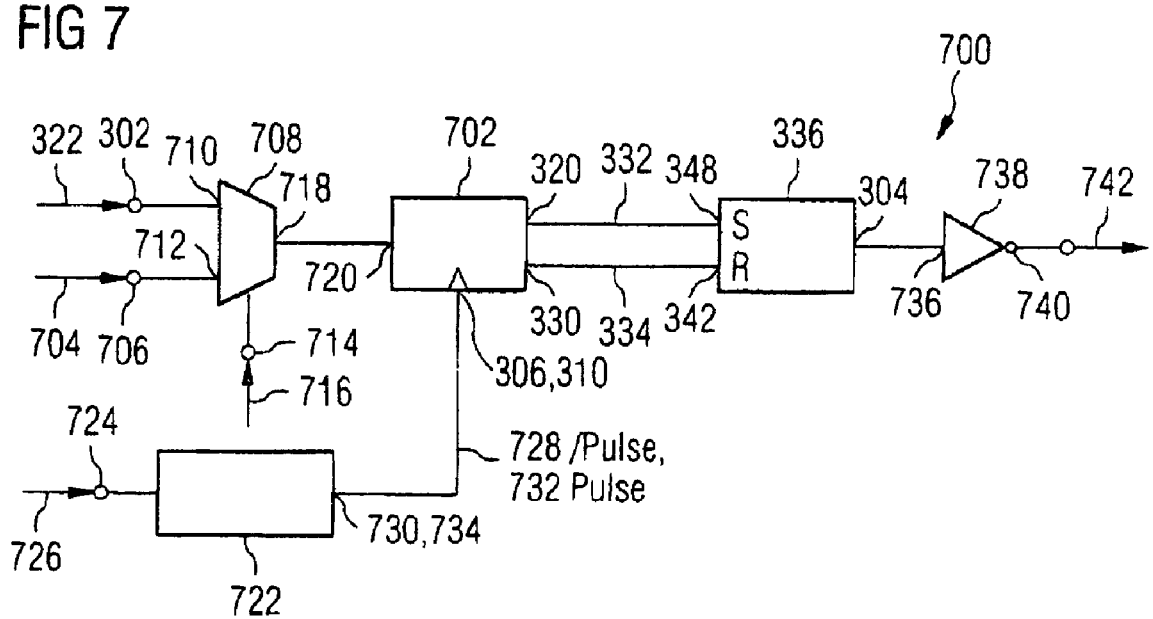
FIG. 7 shows a pulsed flip-flop in accordance with FIG. 3 with scan test extension.

FIG. 7 shows a pulsed flip-flop 700 in accordance with the flip-flop 300 from FIG. 3 with scan test extension.

In addition to the components of the flip-flop 300, for scan test extension in the flip-flop 700 in accordance with FIG. 7, a multiplexer 708 is also provided between the input stage 702, which is formed by the NAND gate 314 and the NOR gate 324, and the data input 302 and a scan test input 706 provided for applying a scan test signal 704.

The multiplexer 708 has a first input 710 (which is coupled to the data input 302, at which the data signal 322 is present), a second input 712 (which is coupled to the scan test input 706, at which the scan test signal 704 is present), a control input 714 (at which a test activation signal 716 (TE) is present), and also an output 718. The output 718 of the multiplexer 708 is coupled to an input 720 of the input stage 702 (more precisely, to the first input 316 of the NAND gate 314 and to the first input 326 of the NOR gate 324).

The data signal 322 or the scan test signal 704 (clearly the data input 302 or the scan test input 706) are switched to the input stage 702 depending on the signal state of the test activation signal 716 and thus depending on the state of the multiplexer 708 (for example for TE=1: scan test operating mode, that is to say that the scan test signal 704 is passed to the output 718 of the multiplexer 708; for TE=0: data operating mode (normal operating mode), that is to say that the data signal 322 is passed to the output 718 of the multiplexer 708).

Furthermore, the pulsed flip-flop 700 has a pulse clock signal generator 722, which, in accordance with an embodiment, has the same structure as the pulse generator 202 of the flip-flop 200 in accordance with FIG. 2, for which reason a detailed description again is dispensed with at this juncture.

The pulse clock signal generator 722 has a clock signal input 724, to which a flip-flop-external clock signal 726 (CLK) is applied. When the flip-flop-external clock signal 726 is present, the pulse clock signal generator 722 generates a flip-flop-internal pulse signal 728 (/PULSE) at a first pulse output 730. Furthermore, in this case, the pulse clock signal generator 722 generates a complementary pulse signal 732 (PULSE), which is complementary to the flip-flop-internal pulse signal 728 (/PULSE), and provides it at a second pulse output 734 and feeds it to the input stage 702 (by way of example, the flip-flop-internal pulse signal 728 (/PULSE) is fed to the second pulse clock signal input 310 and the complementary pulse signal 732 (PULSE) is fed for example to the first pulse clock signal input 306).

The signal provided at the data output 304 is passed to an input 736—which is coupled to the data output 304—of an output buffer 738, at the output 740 of which an output signal 742 (/Q) is provided.

Figure 8:
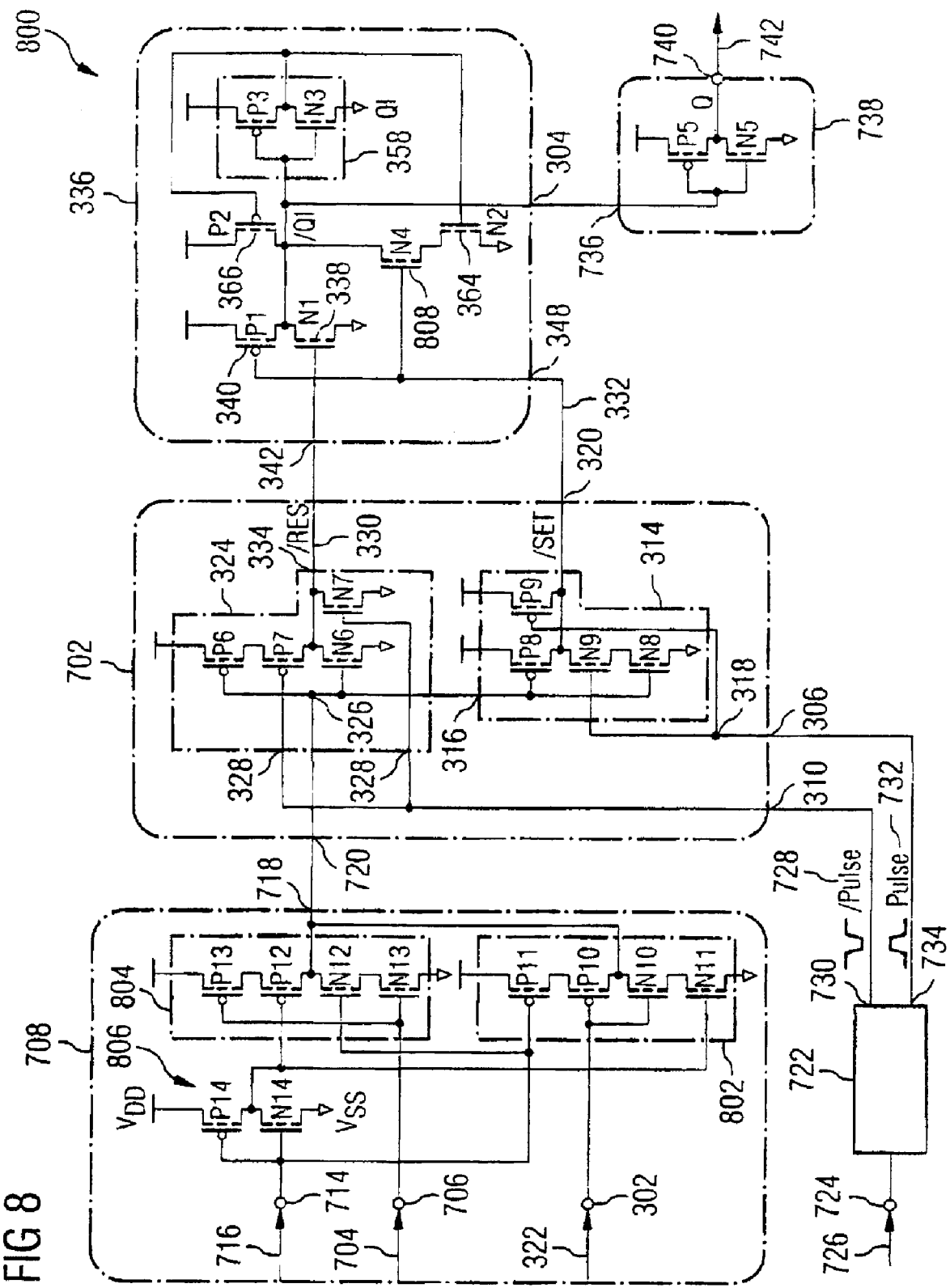
FIG. 8 shows a transistor arrangement of the pulsed flip-flop with scan test extension in accordance with FIG. 7.

FIG. 8 shows a transistor arrangement 800 of the pulsed flip-flop 700 with scan test extension in accordance with FIG. 7.

In accordance with an embodiment, the multiplexer 708 of the transistor arrangement 800 is constructed from a first C²MOS latch 802 (formed from two NMOS transistors N10, N11 and two PMOS transistors P10, P11), and a second C²MOS latch 804 (formed from two NMOS transistors N12, N13 and two PMOS transistors P12, P13) and a multiplexer input inverter 806 (formed from an NMOS transistor N14 and a PMOS transistor P14) coupled to the scan test input 706.

As was explained in connection with FIG. 7, depending on the signal state of the test activation signal 716 and thus depending on the state of the multiplexer 708, the data signal 322 or the scan test signal 704 is passed through the multiplexer 708 to the output 718 and then passed to data input 720 of the input stage 702 (for example for TE=1: scan test operating mode, that is to say that the scan test signal 704 is passed to the output 718 of the multiplexer 708; for TE=0: data operating mode (normal operating mode), that is to say that the data signal 322 is passed to the output 718 of the multiplexer 708).

The input stage 702 contains the NAND gate 314 (formed from the NMOS transistors N8, N9 and the PMOS transistors P8, P9) and also the NOR gate 324 (formed from the NMOS transistors N6, N7 and the PMOS transistors P6, P7).

In addition to the components illustrated in FIG. 3, the set/reset latch (RS latch) 336 also has an additional NMOS transistor 808 (N4), which is connected between the source-drain path of the NMOS hold transistor 364 (N2) and the source-drain path of the PMOS hold transistor 366 (P2) and the gate terminal of which is coupled to the gate terminal 348 of the PMOS push-pull transistor 340 (P1). The inverter 358 is formed by an NMOS transistor N3 and a PMOS transistor P3.

The output buffer 738 is formed by an NMOS transistor N5 and a PMOS transistor P5.

Figure 9:
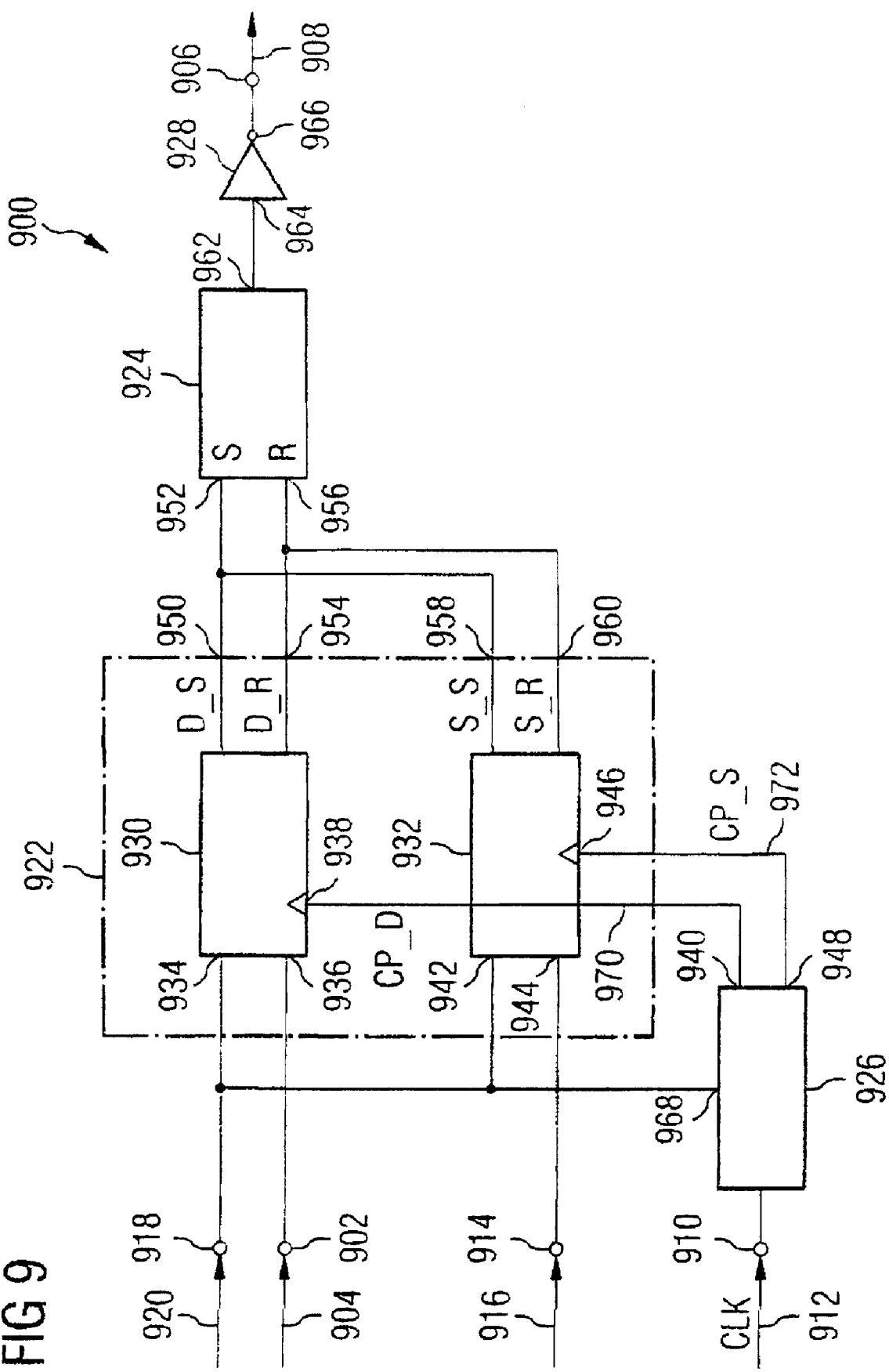
FIG. 9 shows a pulsed flip-flop with scan test extension in accordance with an embodiment.

FIG. 9 shows a pulsed flip-flop 900 with scan test extension in accordance with an embodiment.

In contrast to the flip-flop 700 in accordance with FIG. 7, no multiplexer is required in the case of the pulsed flip-flop 900 in accordance with FIG. 9.

The pulsed flip-flop 900 has a data input 902 (at which a data signal 904 is present), a data output 906 (at which an output signal 908 (Q) is provided), a clock signal input 910 (to which a flip-flop-external clock signal 912 (CLK) is applied), a scan test input 914 (at which a test signal 916 is present), and also a test activation input 918 (at which a test activation signal 920 (TE) is present).

Furthermore, the flip-flop 900 has an input stage 922, a latch (also referred to as hold element), (in accordance with an embodiment a set/reset latch (SR latch)) 924, a pulse clock signal generator 926 and also an output buffer 928.

In contrast to the flip-flop 700 in accordance with FIG. 7, the input stage 922 (in an embodiment clearly realized as an active input stage) in the case of the flip-flop 900 in accordance with FIG. 9 has two tristate-enabled partial input stages 930, 932 connected in parallel, in accordance with an embodiment a data input stage 930 and a scan test input stage 932, which are both driven by the pulse clock signal generator 926. As will be explained in even more detail below, the two partial input stages 930, 932, for their part, drive the SR latch 924 in order to write to the latter a first state (for example a logic state "0") or a second state (for example a logic state "1").

A first input 934 of the data input stage 930 is coupled to the test activation input 918, a second input 936 of the data input stage 930 is coupled to the data input 920, and a clock signal input 938 of the data input stage 930 is coupled to a first pulse output 940 of the pulse clock signal generator 926.

A first input 942 of the scan test input stage 932 is coupled to the test activation input 918, a second input 944 of the scan test input stage 932 is coupled to the scan test input 914, and a clock signal input 946 of the scan test input stage 932 is coupled to a second pulse output 948 of the pulse clock signal generator 926.

A first output 950 (also referred to as set output (D_S)) of the data input stage 930 is coupled to a first input 952 (also referred to as set input (S)) of the SR latch 924, and a second output (also referred to as reset output (D_R)) 954 of the data input stage 930 is coupled to a second input 956 (also referred to as reset input (R)) of the SR latch 924.

Furthermore, a first output 958 (also referred to as set output (S_S)) of the scan test input stage 932 is coupled to the first input 952 (also referred to as set input (S)) of the SR latch 924, and a second output (also referred to as reset output (S_R)) 960 of the scan test input stage 932 is coupled to the second input 956 (also referred to as reset input (R)) of the SR latch 924.

An output 962 of the SR latch 924 is coupled to an input 964 of the output buffer 928.

The output 966 of the output buffer 928 (at which the data output signal 908 is provided) is coupled to the data output 906.

Depending on the state (to put it another way depending on the operating mode of the flip-flop 900), different signals are fed to the latch 924.

If the flip-flop 900 is in a scan test operating mode, in which the flip-flop (which is contained for example in the pipeline stage 500) 900 is tested in accordance with a scan test method, then the first output (D_S) 950 of the data input stage 930 and the second output (D_R) 954 of the data input stage 930 are in the tristate state (for example in the case where the test activation signal 920 has a logic high level (TE=1) and the signals provided at the first output (S_S) 958 of the scan test input stage 932 and the second output (S_R) 960 of the scan test input stage 932 are fed to the first input (S) 952 of the SR latch 924 and the second input 956 (R) of the SR latch 924 (to put it another way, the following clearly holds true: S=S_S and R=S_R)).

However, if the flip-flop 900 is in a normal operating mode, in which the flip-flop 900 processes the data signal 904 present in a customary manner, then the first output (S_S) 958 of the scan test input stage 932 and the second output (S_R) 960 of the scan test input stage 932 are in the tristate state (for example in the case where the test activation signal 920 has a logic low level (TE=0) and the signals provided at the first output (D_S) 950 of the data input stage 930 and the second output (D_R) 954 of the data input stage 930 are fed to the first input (S) 952 of the SR latch 924 and the second input 956 (R) of the SR latch 924 (to put it another way, the following clearly holds true: S=D_S and R=D_R)).

Furthermore, the test activation input 918 is coupled to a test input 968 of the pulse clock signal generator 926. The pulse clock signal generator 926 is controlled by the test activation signal 920, which is fed to it by means of the test activation input 918, in such a way as to provide respectively suitable clock signals 970, 972 for the data input stage 930 and the scan test input stage 932, namely a data clock signal 970 (CP_D) fed to the clock signal input 938 of the data input stage 930 and a scan test clock signal 972 (CP_S) fed to the clock signal input 946 of the scan test input stage 932. Generally a drive circuit is provided, which is configured to generate a pulsed clock signal for the data input stage and a signal for driving the scan test input stage. The clock generator can be configured in such a way that the pulse clock signal has a pulse width that is less than half the clock period of the pulse clock signal.

Consequently, on account of the tristate capability of the data input stage 930 and the scan test input stage 932, in accordance with an embodiment, it is possible both to accelerate the time-critical D-Q propagation path, since the multiplexer 708 that is also provided in the flip-flop 700 in accordance with FIG. 7 is obviated, and to configure the scan test input stage 932 in such a way as to result in short hold times in the test operating mode.

Figure 10:
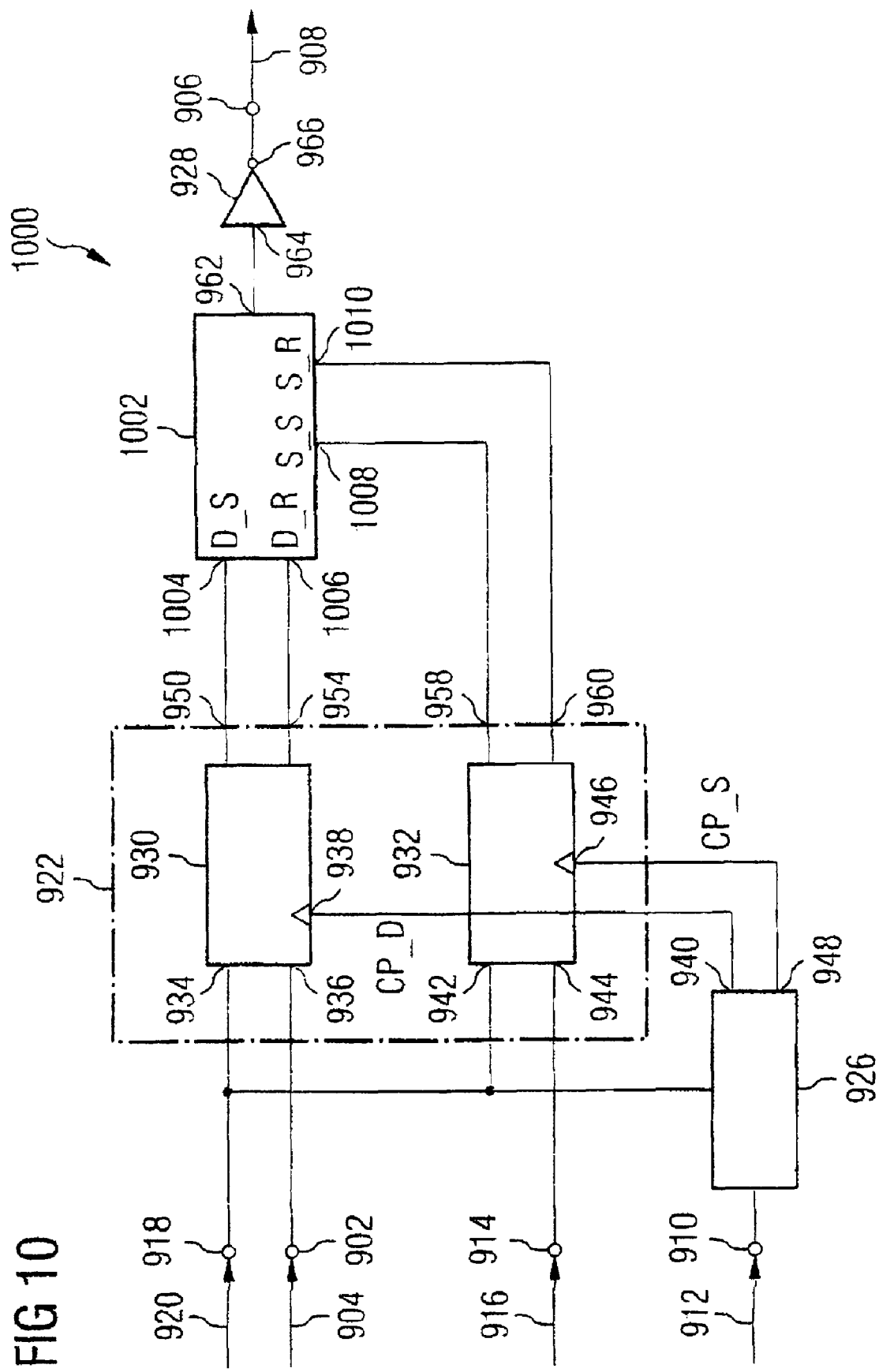
FIG. 10 shows a pulsed flip-flop with scan test extension in accordance with another embodiment.

FIG. 10 shows a pulsed flip-flop 1000 with scan test extension in accordance with another embodiment.

The pulsed flip-flop 1000 in accordance with FIG. 10 differs from the pulsed flip-flop 900 in accordance with FIG. 9 primarily in that a modified latch 1002 (for example an SR latch 1002) is provided, in which different paths are provided for the normal operating mode and in the scan test operating mode, as will be explained in even more detail below. For this purpose, the latch 1002 has a total of four inputs 1004, 1006, 1008, 1010. A first data input 1004 (also referred to as data set input (D_S)) is coupled to the first output 950 of the data input stage 930. A second data input 1006 (also referred to as data reset input (D_R)) is coupled to the second output 954 of the data input stage 930. A first scan test input 1008 (also referred to as scan test set input (S_S)) is coupled to the first output 958 of the scan test input stage 932. A second scan test input 1010 (also referred to as scan test reset input (S_R)) is coupled to the second output 960 of the scan test input stage 932.

Consequently, the latch 1002 in accordance with this embodiment is driven by two separate paths, a first path (D_S, D_R) and a second path (S_S, S_R). Both paths are tristate-enabled (to put it another way they can be switched in high-impedance state). An improved transistor arrangement is made possible by this embodiment, thus resulting in speed advantages for the time-critical path D→(D_S, D_R)→Q.

Figure 11:
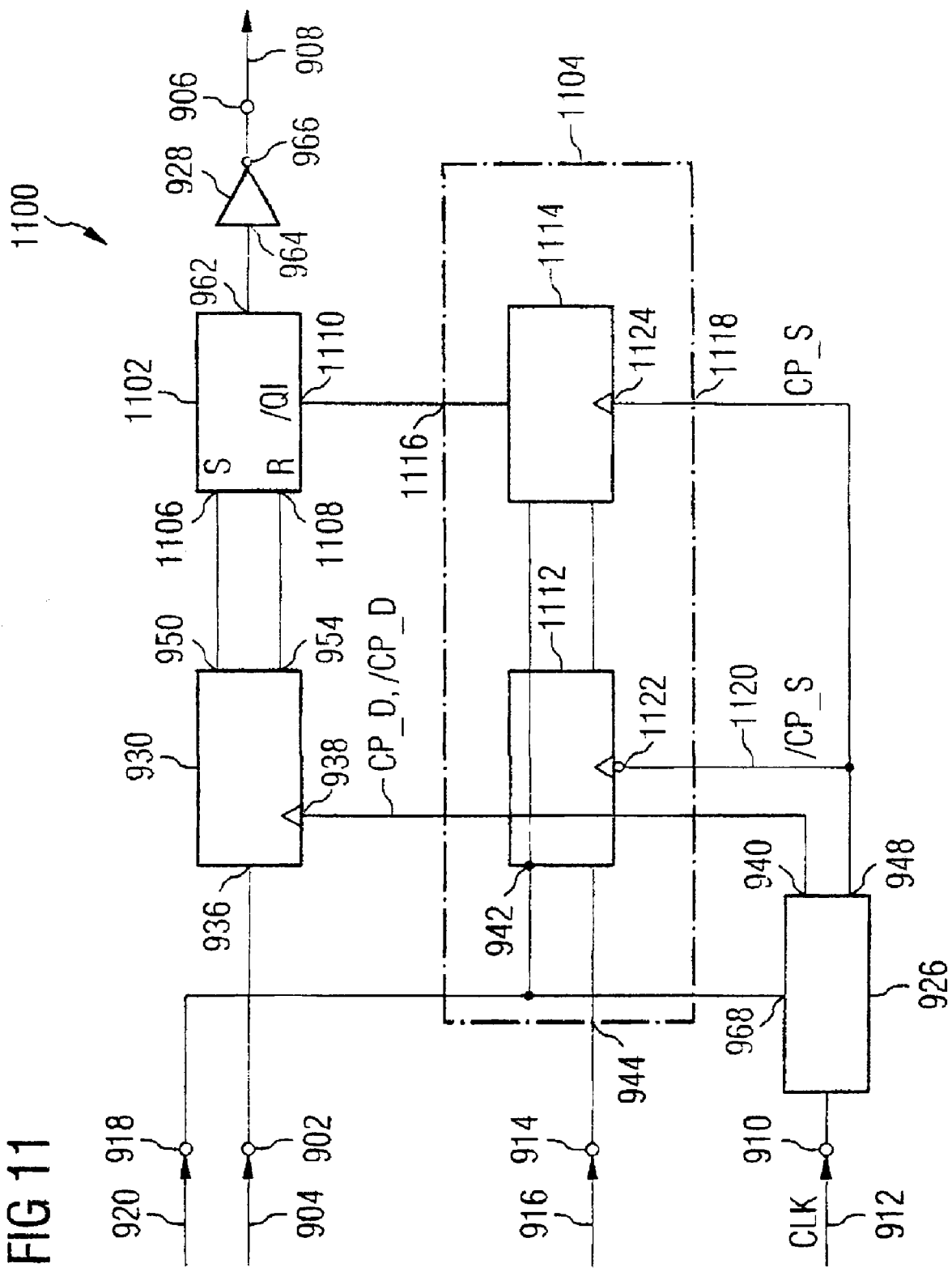
FIG. 11 shows a pulsed flip-flop with scan test extension in accordance with another embodiment.

FIG. 11 shows a pulsed flip-flop 1100 with scan test extension in accordance with another embodiment.

The pulsed flip-flop 1100 in accordance with FIG. 11 differs from the pulsed flip-flop 900 in accordance with FIG. 9 primarily in that a modified latch 1102 (for example an SR latch 1102) and also a modified scan test input stage 1104 are provided.

The latch 1102 has a first input 1106 (also referred to as set input (S)), which is coupled to the first output 950 of the data input stage 930. A second input 1108 (also referred to as reset input (R)) of the latch 1102 is coupled to the second output 954 of the data input stage 930. Furthermore, an additional scan test input 1110 is also provided in the latch 1102. The scan test input 1110 is coupled to the internal storage node of the latch 1102, as will be explained in more detail below.

It should furthermore be noted that, in this embodiment, the data input stage 930 is not coupled to the test activation input 918. Consequently, no first input 934 is provided in the data input stage 930 in accordance with this embodiment.

Furthermore, the modified scan test input stage 1104 has a scan master latch 1112 and also a scan slave latch 1114. The scan master latch 1112 and also the scan slave latch 1114 clearly form a master-slave latch pair with scan functionality. In this embodiment, the scan test input stage 1104 has only one output 1116, which is coupled to the scan test input 1110.

Clearly, in accordance with this embodiment, the set input 1106 and the reset input 1108 of the SR latch 1102 are driven directly by means of the data input stage 930. The scan test function is implemented in two stages as a master-slave latch pair and is operated with conventional clock signals 1118 (CP_S) (is provided at a scan slave latch clock input 1124 of the scan slave latch 1114) and 1120 (/CP_S) (is provided at a scan master latch clock input 1122 of the scan master latch 1112, the clock signal 1120 (/CP_S) being complementary to the clock signal 1118 (CP_S) in accordance with an embodiment) provided by the pulse clock signal generator 926 at the second pulse output 948 thereof. In accordance with this embodiment, the pulse clock signal generator 926 is configured in such a way that the pulsed clock signals (CP_D and /CP_D) which are provided at the first pulse output 940 of the pulse clock signal generator 926 and are fed to the clock signal input 938 of the data input stage 930 are suppressed in the test operating mode. An implicit tristate capability is thereby realized which prevents the propagation of the data signal 904 present at the data input 902 into the SR latch 11102.

The scan slave latch 1114 (clearly a slave switch) is tristate-enabled and couples the output of the scan master latch 1112 during the test phase (that is to say in the test operating mode) on the rising clock signal edge to the internal storage node /QI of the SR latch 1102.

This flip-flop 900 has a short, three-stage depth in the normal operating mode and opens up the possibility of optimizing the component parts of the master-slave latch pair through suitable transistor dimensioning, transistor arrangement and transistor interconnection in such a way as to ensure short hold times in the test operating mode.

Figure 12:
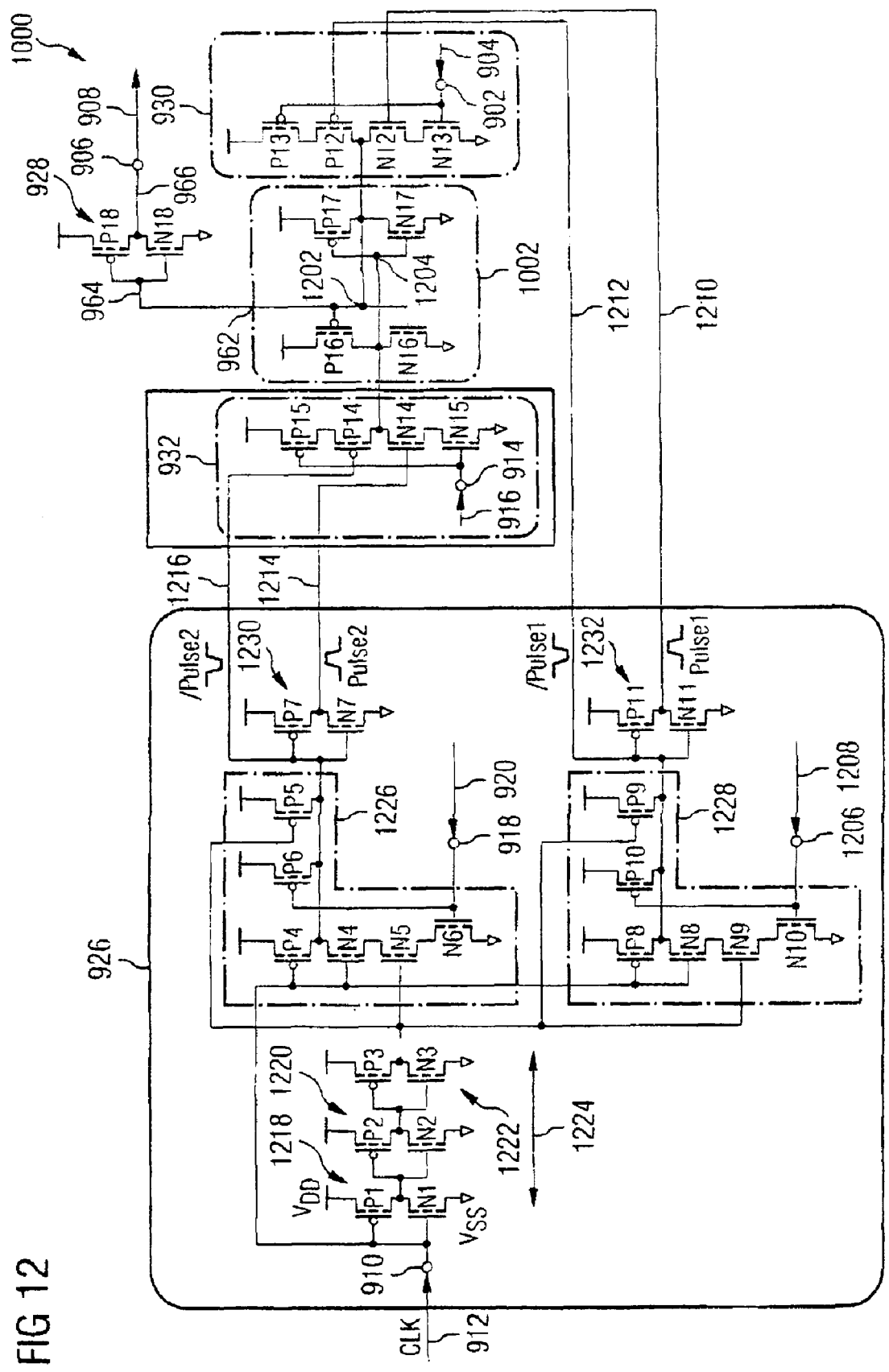
FIG. 12 shows a circuitry realization of the pulsed flip-flop with scan test extension in accordance with FIG. 10 at the transistor level in accordance with an embodiment.

FIG. 12 shows a circuitry realization of the pulsed flip-flop 1000 with scan test extension in accordance with FIG. 10 at the transistor level in accordance with an embodiment.

This embodiment is particularly suitable for small-area flip-flops or for flip-flops with low requirements made of the driver capability (for example of the buffer 928).

In accordance with this embodiment, the SR latch 1002 is clearly driven in each case at both storage nodes (first storage node 1202 and second storage node 1204) by the tristate-enabled scan test input stage 932 and the tristate-enabled data input stage 930 (which clearly represent tristate-enabled switches in each case).

The scan test input stage 932 and the data input stage 930 are embodied as C²MOS latches, wherein the scan test input stage 932 is formed by two NMOS transistors N14, N15 and two PMOS transistors P14, P15, and wherein the data input stage 930 is formed by two NMOS transistors N12, N13 and two PMOS transistors P12, P13. Consequently, for example the C²MOS latch of the scan test input stage 932 and the C²MOS latch of the data input stage 930 each have a sample stage and a hold stage.

One effect of this arrangement is the small logic depth from the data input 902 (D) to the data output 906 (Q) of this arrangement, which, in this embodiment, has only three stages and therefore brings about a short D-Q delay time (D-Q delay) despite the scan functionality provided.

By means of the test activation input 918 (at which a test activation signal 920 (TE) is present) and an additionally provided inverse test activation input 1206 (at which an inverse test activation signal 1208 (/TE) is present), the state of the flip-flop 1000 is defined and the implicit tristate capability is realized by means of the output of the pulse clock signal generator 926 being split into two branches. This makes it possible, in the test operating mode (for example for TE=1 and /TE=0), to hold the output signals of the pulse clock signal generator 926, namely a data output signal 1210 (PULSE1=0) and also an inverse data output signal 1212 (/PULSE1=1), at a constant electrical potential and thus to prevent an evaluation of the data signal 904 (D) in the data input stage 930 by virtue of the transistors N12 and P12 of the data input stage 930 being closed. At the same time, however, a test output signal 1214 (PULSE2=1) and an inverse test output signal 1216 (/PULSE2=0) (for example in the form of pulses) are generated and they open the transistors N14 and P14 of the scan test input stage 932 for the duration of the pulse. In this way, the test signal 916 is assessed and written to the SR latch 1002. In the normal operating mode (to put it another way in the normal flip-flop mode), for example for TE=0 and /TE=1, the test output signal 1214 (PULSE2=0) and the inverse test output signal 1216 (/PULSE2=1) are suppressed and the transistors N14 and P14 of the scan test input stage 932 are turned off. Correspondingly, however, the data output signal 1210 (PULSE1=1) and the inverse data output signal 1212 (/PULSE1=0) (for example in the form of pulses) are generated and they open the transistors N12 and P12 of the data input stage 930 for the duration of the pulse.

The SR latch 1002 is formed in an inherently conventional manner by two NMOS transistors N16, N17 and two PMOS transistors P16, P17, which are interconnected with one another as two cross-coupled inverters.

The output buffer 928 is formed by an NMOS transistor N18 and a PMOS transistor P18.

The pulse clock signal generator 926 has three inverters coupled to one another in series (a first inverter 1218 (formed by the transistors N1, P1), a second inverter 1220 (formed by the transistors N2, P2), a third inverter 1222 (formed by the transistors N3, P3)), which clearly form a delay chain (symbolized by an arrow 1224 in FIG. 12). Furthermore, the pulse clock signal generator 926 has a first NAND gate 1226 (formed by the NMOS transistors N4, N5, N6 and the PMOS transistors P4, P5, P6) (wherein an input of the first NAND gate 1226 is coupled to the test activation input 918) and a second NAND gate 1228 (formed by the NMOS transistors N8, N9, N10 and the PMOS transistors P8, P9, P10) (wherein an input of the second NAND gate 1228 is coupled to the inverse test activation input 1206). Furthermore, a first output inverter 1230 (formed by the transistors N7, P7) coupled to the output of the first NAND gate 1226 and a second output inverter 1232 (formed by the transistors N11, P11) coupled to the output of the second NAND gate 1228 are provided, which provide the output signals PULSE1 (and /PULSE1) and PULSE2 (and /PULSE2) described above. The flip-flop external clock signal 912 (CLK) is applied to the transistors P4 and N4 and P8, N8. The test activation signal 920 (TE) is applied to the transistors P6 and N6. The inverse test activation signal 1208 (/TE) is applied to the transistors P10 and N10. An inversely delayed clock signal is applied to the transistors P5 and N5 and P9 and N9, the delay time being given by the delay chain (symbolized by the arrow 1224 in FIG. 12).

Figure 13:
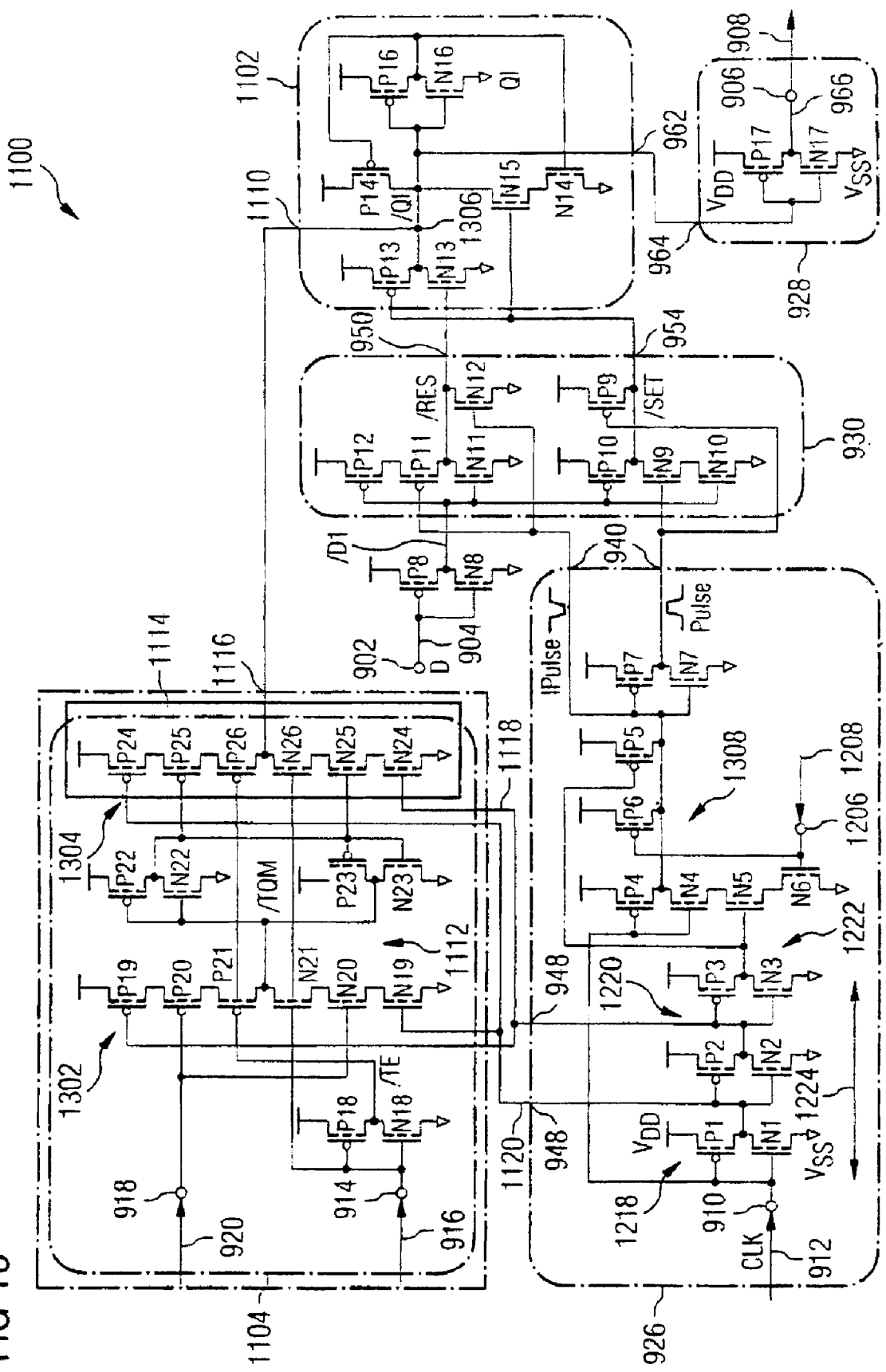
FIG. 13 shows a circuitry realization of the pulsed flip-flop with scan test extension in accordance with FIG. 11 at the transistor level in accordance with an embodiment.

FIG. 13 shows a circuitry realization of the pulsed flip-flop 1100 with scan test extension in accordance with FIG. 11 at the transistor level in accordance with an embodiment.

The changes made in comparison with the flip-flop 800 in accordance with FIG. 8 can be seen for example on a transistor basis in the scan test input stage 1104, the pulse clock signal generator 926 and the connection of the scan test input stage 1104 to the internal storage node /QI of the SR latch 1102. The scan test input stage 1104 includes as input stage a modified C²MOS latch 1302 (e.g. the scan master latch 1112) (formed by the transistors N19, P19, N20, P20, N21, P21), which is either deactivated, that is to say in the tristate mode, in the normal operating mode (for example for TE=0) or is operated actively in the test operating mode (for example for TE=1) since the transistors N21, P21 are open.

On the rising clock signal edge, the scan master latch 1112 samples, with opening of a further modified C²MOS latch 1304 (e.g. the scan slave latch 1114) (formed by the transistors N24, P24, N25, P25, N26, P26).

In this way, the internal storage node 1306 of the flip-flop stage is set to the first supply potential (e.g. $V_{DD}$) or the second supply potential (e.g. $V_{SS}$) depending on the logic level of the test signal 916 present at the test input 914.

The transistors N14, P14, N16, P16 in the SR latch 1102 form a feedback and store the datum written in. In order to prevent a conflict with the data input stage 930 (also referred to as SET/RESET stage in this embodiment), in this embodiment the output signals PULSE and /PULSE provided at the first pulse output 940 of the pulse clock signal generator 926 are suppressed by the pulse clock signal generator 926 (that is to say that e.g. PULSE=0 and /PULSE=1 hold true). The push-pull transistors N13, P13 that are likewise provided in the SR latch 1102 are thereby switched off.

The pulse suppression (which corresponds to an implicit tristate capability of the data input stage 930) of the pulse clock signal generator 926 is realized by the triple NAND gate 1308 (formed by the transistors N4, P4, N5, P5, N6, P6) in the pulse clock signal generator 926. In the test operating mode, for this reason the transistor N6 is switched off and the transistor P6 is switched on. In the normal operating mode as a pulsed flip-flop, the transistor N6 is switched on and the transistor P6 is switched off.

The extra outlay in respect of area for a standard cell implementation amounts to seven transistor fingers compared with the flip-flop 800 in accordance with FIG. 8. Through suitable dimensioning of the transistors within the scan test input stage 932, it is possible to increase the CLK-Q delay time in the test operating mode. This brings about significantly longer hold times in comparison with pulsed flip-flops, thereby reducing the risk of so-called races in pipeline structures.

It should be noted that the modified C²MOS latches 1302, 1304 of the scan test input stage 932 can also be converted into transmission gates. Furthermore, a multiple utilization of the transistors N21, P21 is possible, such that the transistors N26, P26 can be dispensed with as a result of the rearrangement in the transistor stacks of the modified C²MOS latches 1302, 1304 of the scan test input stage 932.

Figure 14:
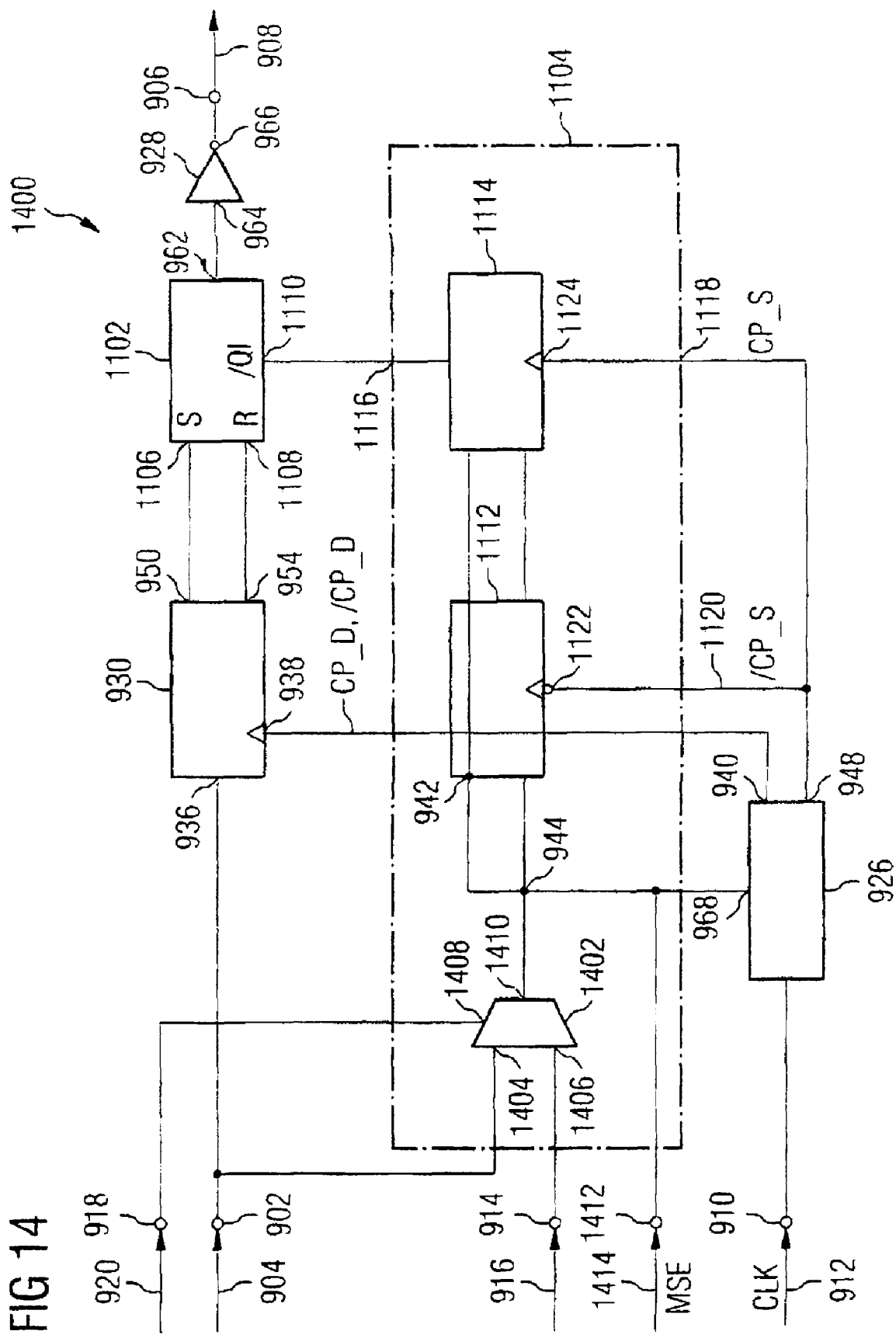
FIG. 14 shows a pulsed flip-flop with scan test extension in accordance with another embodiment.

FIG. 14 shows a pulsed flip-flop 1400 with scan test extension in accordance with another embodiment.

The flip-flop 1400 in accordance with FIG. 14 has a similar construction to the flip-flop 1100 in accordance with FIG. 11, for which reason only the differences between these two flip-flops will be described below.

The flip-flop 1400 in accordance with FIG. 14 additionally has a multiplexer 1402, which is clearly connected between the second input 944 of the scan test input stage 932 and the test input 914.

The multiplexer 1402 has a first input 1404 coupled to the data input 902, a second input 1406 coupled to the test input 914, a control input 1408 coupled to the test activation input 918, and also an output 1410 coupled to the second input 944 of the scan test input stage 932.

In contrast to the flip-flop 1100 in accordance with FIG. 11, in the case of the flip-flop 1400 in accordance with FIG. 14, the test input 968 of the pulse clock signal generator 926 is not coupled to the test activation input 918 (though it is still coupled to the second input 944 of the scan test input stage 932), but rather to an additionally provided master-slave activation input 1412, at which a master-slave activation signal (MSE) 1414 is present.

In this way, a dual-mode pulsed flip-flop with scan test functionality is provided in accordance with one embodiment.

The flip-flop 1400 is operated in accordance with an embodiment for extremely high performance as a pulsed flip-flop for example with a negative setup time or as a conventional master-slave latch pair in the test operating mode and in a low-power operating mode. This is made possible in accordance with an embodiment by virtue of the master-slave latch pair being activated by the master-slave activation signal (MSE) 1414 separately from the test operating mode, which is controlled by means of the test activation signal 920. Possible operating modes for the flip-flop 1400 in accordance with FIG. 14 are presented in the table below:

| MSE | TE | Flip-flop mode | Function |
|---|---|---|---|
| 0 | 0 | Pulsed flip-flop | Normal |
| 1 | 0 | Master-slave latch pair | Normal |
| 0 | 1 | Forbidden | Forbidden |
| 1 | 1 | Master-slave latch pair | Scan test |

During operation as a master-slave latch pair (for example for MSE=1), the pulse signals CP_D (and /CP_D) are suppressed in the pulse clock signal generator 926 (implicit tristate capability). Depending on the operating mode, the flip-flop 1400 is then operated for example for TE=0 as a conventional master-slave latch pair in the low-power operating mode. For this purpose, the data signal 904 is propagated through the multiplexer 1402, the scan master latch 1112 and also the scan slave latch 1114 into the SR latch 1102. In the test operating mode (for example for TE=1), instead of the data signal 904, the test signal 916 is selected by the multiplexer 1402 and propagated through the latter and also through the scan master latch 1112 and the scan slave latch 1114 into the SR latch 1102.

One effect of this configuration may be seen in that in the low-power operating mode, for example, the active power consumption of the pulse clock signal generator 926 and of the data input stage 930 is eliminated or reduced and the total power loss of the flip-flop 1400, particularly in the case of low data activity, is reduced. This property results from the high energy efficiency of the master-slave latch pair.

Figure 15:
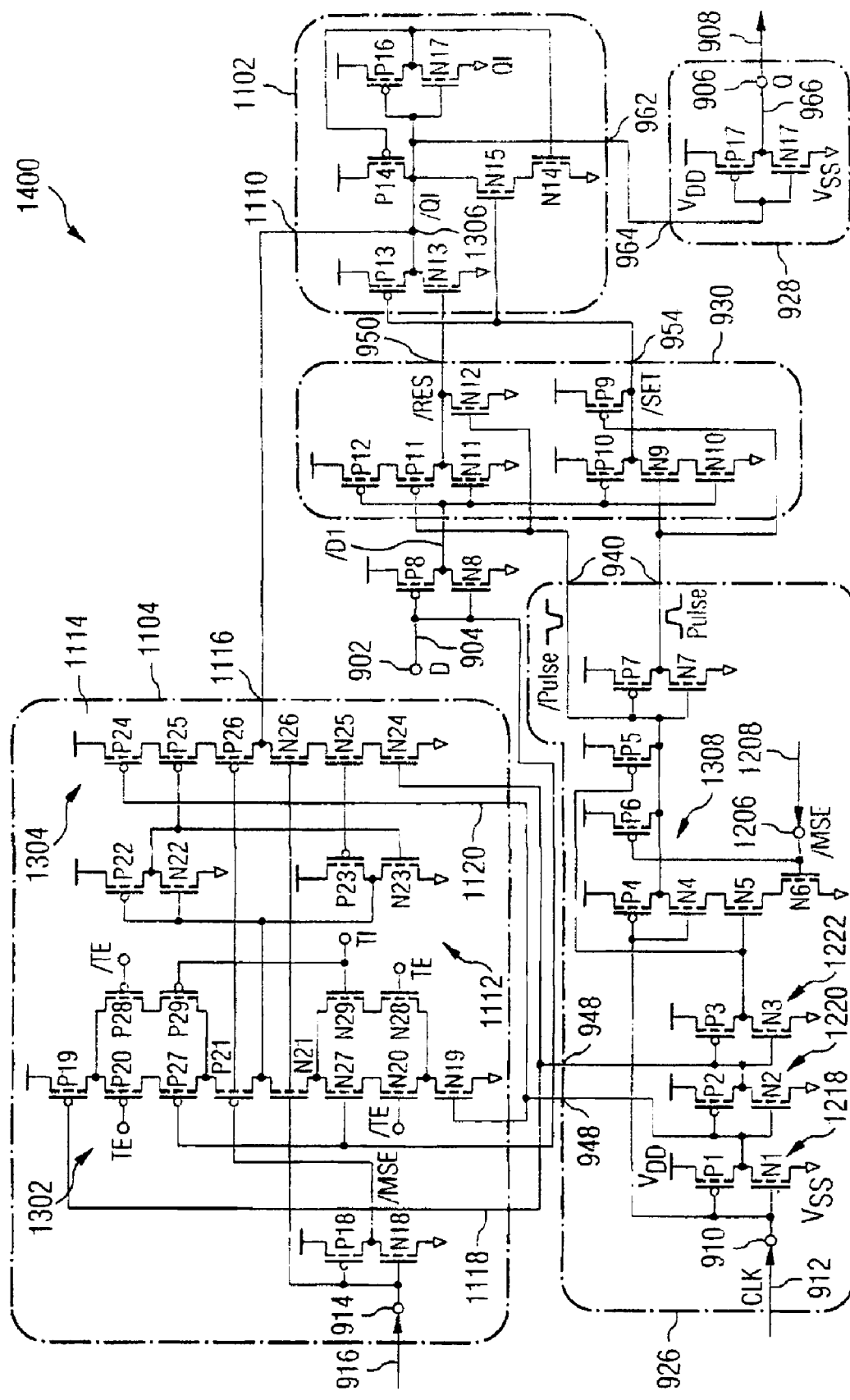
FIG. 15 shows a circuitry realization of the pulsed flip-flop with scan test extension in accordance with FIG. 14 at the transistor level in accordance with an embodiment.

FIG. 15 shows a circuitry realization of the pulsed flip-flop 1400 with scan test extension in accordance with FIG. 14 at the transistor level in accordance with an embodiment.

One difference with respect to the circuitry realization of the pulsed flip-flop 1100 in accordance with FIG. 13 is the doubly used data input 902 in accordance with this embodiment, said data input both being used in the master stage, that is to say in the scan master latch 1112 of the scan test input stage 1104, and being processed further in the set/reset pulse generator, for example of the data input stage 930, in the form of the inverted data input signal /D1.

The test operating mode is defined by means of the states of the transistors N20, P20, N28, P28. The inverted master-slave activation signal (/MSE=0) suppresses the pulse generation in the pulse clock signal generator 926 (implicit tristate capability) by the transistors N6, P6.

FIG. 16 shows a method 1600 for operating a circuit arrangement in accordance with an embodiment.

This method proceeds from the fact that the circuit arrangement includes a scan test input stage having a test input for receiving a test signal, wherein the scan test input stage can be switched in high-impedance state, a data input stage having a data input for receiving a data signal, wherein the data input stage can be switched in high-impedance state, and a latch coupled to at least one output of the scan test input stage and to at least one output of the data input stage.

After the method has been started in 1602, in 1604, the circuit arrangement is operated in a scan test operating mode and the data input stage is switched in high-impedance state, such that a test signal present at the test input is fed to the latch.

As an alternative, after the method has been started, in 1606 the circuit arrangement is operated in a data operating mode and the scan test input stage is switched in high-impedance state, such that a data signal present at the data input is fed to the latch.

In accordance with an embodiment, a first pulse clock signal is generated for operating the data input stage, and a second pulse clock signal is generated for operating the scan test input stage.

In accordance with another embodiment, a first pulse clock signal is generated for operating the data input stage, and a clock signal is generated for edge-triggered operation of the scan test input stage.

In accordance with an embodiment, tristate-enabled partial input stages are provided for the test operating mode and the normal operating mode of a flip-flop via the data input at which the data signal to be processed is fed in. This makes it possible to separate the scan test path (test signal to latch (for example SR latch)) and the data input path (data signal to latch (for example SR latch)). This separation makes it possible, in accordance with an embodiment, to slow down the circuit components of the scan test extension in such a way that a long CLK-Q delay time arises. This increases the so-called race immunity R (which results in accordance with the following specification: R $t_{CLK-Q}-t_{HOLD}$, where $t_{CLK-Q}$ denotes the CLK-Q delay time and $t_{HOLD}$ denotes the hold time) of flip-flops in short paths such as the scan test path, without slowing down the time-critical D-Q path.

The property that the hold time in a conventional master-slave latch pair is very short (for example within a range of approximately 10 ps to approximately 30 ps for CMOS RVT (regular voltage threshold) devices having a supply voltage of approximately 1.32 V in a 65 nm technology) and R>>0 ps thus holds true is utilized in an embodiment insofar as the abovementioned separation of the tristate-enabled paths scan test path and data input path makes it possible to operate the flip-flop as a master-slave latch pair and thus to profit from the increased race immunity. In this sense the flip-flop has a dual-mode capability, which is utilized in one embodiment (for example in the flip-flop 1400 in accordance with FIG. 14) for reducing the active power consumption.

Optionally, in various embodiments, it is possible to optimize the slowing down of the CLK-Q time $t_{CLK-Q}$ in the master-slave mode through corresponding transistor dimensionings or through the use of high threshold voltage transistors (high $V_t$ transistors) or high threshold voltage/medium gate oxide thickness transistors (high $V_t$/medium GOX transistors).

It should be pointed out that in an embodiment the operating mode can be changed dynamically within a clock period by means of setting for example the master-slave activation signal (MSE) 1414 according to the table described above.

In alternative embodiments, in the above circuit arrangements, signal pulses are generated both upon rising clock signal edges and upon falling clock signal edges and a double-edge-triggered flip-flop is respectively provided in this way.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A circuit arrangement, comprising:
a scan test input stage having a test input for receiving a test signal and a test activation input to receive a test activation signal, wherein an output of the scan test input stage can be switched to a tristate state;
a data input stage having a data input for receiving a data signal and a test activation input to receive the test activation signal, wherein an output of the data input stage can be switched to a tristate state;
a latch coupled to at least one output of the scan test input stage and to at least two outputs of the data input stage; and
a drive circuit, which is configured to generate a pulsed clock signal for the data input stage and a signal for driving the scan test input stage.

2. The circuit arrangement as claimed in claim 1, wherein the drive circuit has a pulse generator circuit,
wherein the pulse generator circuit contains a first clock generator output, a second clock generator output, and a test activation input to receive the test activation signal;
wherein the scan test input stage furthermore has a clock signal input coupled to the first clock generator output;
wherein the data input stage furthermore has a clock signal input coupled to the second clock generator output.

3. The circuit arrangement as claimed in claim 1, wherein the latch comprises a hold stage with a set/reset device.

4. The circuit arrangement as claimed in claim 1, wherein the scan test input stage has a latch.

5. The circuit arrangement as claimed in claim 4, wherein the scan test input stage comprises a sample stage and a hold stage.

6. The circuit arrangement as claimed in claim 1, wherein the data input stage comprises a sample stage.

7. The circuit arrangement as claimed in claim 6, wherein the data input stage has a sample stage and a hold stage.

8. The circuit arrangement as claimed in claim 1, wherein:
the scan test input stage comprises a scan test master latch coupled to the test input, a scan test slave latch coupled to an output of the scan test master latch, wherein the at least one output of the scan test input stage is coupled to an output of the scan test slave latch;
the latch further comprises a scan test input that receives the at least one output of the scan test input stage, the latch being coupled to at least two outputs of the data input stage.

9. The circuit arrangement as claimed in claim 2, wherein the pulse generator circuit is configured to provide a pulse clock signal at the first clock generator output.

10. The circuit arrangement as claimed in claim 9, wherein the pulse generator circuit is configured in such a way that the pulse clock signal has a pulse width that is less than half the clock period of the pulse clock signal.

11. The circuit arrangement as claimed in claim 8, wherein the scan test master latch is an edge-triggered latch.

12. The circuit arrangement as claimed in claim 8, wherein the scan test slave latch is an edge-triggered latch.

13. The circuit arrangement as claimed in claim 9, furthermore comprising:
a multiplexer, the multiplexer including:
a first input of which is coupled to the data input stage,
a second input of which is coupled to the scan test input stage,
a control input of which is coupled to the test activation input to receive the test activation signal, and
an output of which is coupled to an input of a scan test master latch, and
a scan test master slave activation input coupled to an additional input of the scan test master latch.

14. An electronic device comprising a circuit arrangement, the circuit arrangement comprising:
a scan test input stage having a test input for receiving a test signal and a test activation input to receive a test activation signal, wherein an output of the scan test input stage can be switched to a tristate state;
a data input stage having a data input for receiving a data signal and a test activation input to receive the test activation signal, wherein an output of the data input stage can be switched in high-impedance to a tristate state;
a latch coupled to at least one output of the scan test input stage and to at least two outputs of the data input stage; and
a drive circuit, which is configured to generate a pulsed clock signal for the data input stage and a signal for driving the scan test input stage.

15. The electronic device as claimed in claim 14, configured as a processor.

16. The electronic device as claimed in claim 15, configured as a microprocessor.

17. An electrical apparatus comprising an electronic device, wherein the electronic device comprises a circuit arrangement, wherein the circuit arrangement comprises:
a scan test input stage having a test input for receiving a test signal, wherein an output of the scan test input stage can be switched to a tristate state;
a data input stage having a data input for receiving a data signal, wherein an output of the data input stage can be switched to a tristate state;
a latch coupled to at least one output of the scan test input stage and to at least two outputs of the data input stage; and a drive circuit, which is configured to generate a pulsed clock signal for the data input stage and a signal for driving the scan test input stage.

18. A communication device comprising an electronic device, wherein the electronic device comprises a circuit arrangement, wherein the circuit arrangement comprises:
a scan test input stage having a test input for receiving a test signal, wherein an output of the scan test input stage can be switched to a tristate state;
a data input stage having a data input for receiving a data signal, wherein an output of the data input stage can be switched to a tristate state;
a latch coupled to at least two outputs of the scan test input stage and to at least two outputs of the data input stage; and
a drive circuit, which is configured to generate a pulsed clock signal for the data input stage and a signal for driving the scan test input stage.

19. A method for operating a circuit arrangement, wherein the circuit arrangement comprises:
a scan test input stage having a test input for receiving a test signal and a test activation input to receive a test activation signal, wherein an output of the scan test input stage can be switched to a tristate state;
a data input stage having a data input for receiving a data signal and a test activation input to receive the test activation signal, wherein an output of the data input stage can be switched to a tristate state;
a latch coupled to at least one output of the scan test input stage and to at least two outputs of the data input stage; and
a drive circuit, which is configured to generate a pulsed clock signal for the data input stage and a signal for driving the scan test input stage,
wherein the method comprises:
operating the circuit arrangement in a scan test operating mode and switching the data input stage in high-impedance state, such that a test signal present at the test input is fed to the latch; or
operating the circuit arrangement in a data operating mode and switching the scan test input stage in high-impedance state, such that a data signal present at the data input is fed to the latch.

20. The method as claimed in claim 19, further comprising:
generating a first pulse clock signal for operating the data input stage; and
generating a second pulse clock signal for operating the scan test input stage.

21. The method as claimed in claim 19, further comprising:
generating a first pulse clock signal for operating the data input stage; and
generating a clock signal for edge-triggered operation of the scan test input stage.

\* \* \* \* \*